US011011693B2

(12) United States Patent
Lampert et al.

(10) Patent No.: US 11,011,693 B2
(45) Date of Patent: May 18, 2021

(54) INTEGRATED QUANTUM CIRCUIT ASSEMBLIES FOR COOLING APPARATUS

(71) Applicant: Intel Corporation, Santa Clara, CA (US)

(72) Inventors: Lester Lampert, Portland, OR (US); Ravi Pillarisetty, Portland, OR (US); Nicole K. Thomas, Portland, OR (US); Hubert C. George, Portland, OR (US); Jeanette M. Roberts, North Plains, OR (US); David J. Michalak, Portland, OR (US); Roman Caudillo, Portland, OR (US); Thomas Francis Watson, Portland, OR (US); Stephanie A. Bojarski, Beaverton, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/450,396

(22) Filed: Jun. 24, 2019

(65) Prior Publication Data

US 2020/0403137 A1    Dec. 24, 2020

(51) Int. Cl.
*H01L 39/04*    (2006.01)
*H01L 39/02*    (2006.01)
(Continued)

(52) U.S. Cl.
CPC .......... *H01L 39/025* (2013.01); *G06N 10/00* (2019.01); *H01L 23/46* (2013.01); *H01L 23/552* (2013.01);
(Continued)

(58) Field of Classification Search
CPC ... H01L 39/025; H01L 39/045; H01L 39/223; H01L 39/228; H01L 23/46; H01L 23/552;
(Continued)

(56) References Cited

U.S. PATENT DOCUMENTS 9,589,236 B1 *   3/2017   Abdo .................... H01L 29/778
9,664,562 B1 *   5/2017   Goodnough ........... G01J 3/0286
(Continued)

FOREIGN PATENT DOCUMENTS

WO    2017155531 A1    9/2017
WO    2017213638 A1    12/2017
(Continued)

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
(Continued)

*Primary Examiner* — Jarrett J Stark
(74) *Attorney, Agent, or Firm* — Patent Capital Group

(57) ABSTRACT

Embodiments of the present disclosure describe integrated quantum circuit assemblies that include quantum circuit components pre-packaged, or integrated, with some other electronic components and mechanical attachment means for easy inclusion within a cooling apparatus. An example integrated quantum circuit assembly includes a package and mechanical attachment means for securing the package within a cryogenic chamber of a cooling apparatus. The package includes a plurality of components, such as a quantum circuit component, an attenuator, and a directional coupler, which are integral to the package. Such an integrated assembly may significantly speed up installation and may help develop systems for rapidly bringing up quantum computers.

20 Claims, 15 Drawing Sheets

(51) Int. Cl.
*H01L 39/22* (2006.01)
*G06N 10/00* (2019.01)
*H01L 23/552* (2006.01)
*H01L 27/18* (2006.01)
*H01L 23/46* (2006.01)

(52) U.S. Cl.
CPC ............ *H01L 27/18* (2013.01); *H01L 39/045* (2013.01); *H01L 39/223* (2013.01); *H01L 39/228* (2013.01)

(58) Field of Classification Search
CPC ....... H01L 23/556; H01L 23/60; H01L 27/18; G06N 10/00
See application file for complete search history.

(56) References Cited

U.S. PATENT DOCUMENTS

| | | | | |
|---|---|---|---|---|
| 10,127,499 | B1* | 11/2018 | Rigetti | G06F 15/16 |
| 10,223,084 | B1* | 3/2019 | Dunn | G06N 10/00 |
| 10,374,612 | B1* | 8/2019 | Sinclair | H03K 19/195 |
| 10,496,934 | B2* | 12/2019 | Rigetti | G06F 13/4068 |
| 10,505,245 | B2* | 12/2019 | Olivadese | H01P 1/30 |
| 10,535,809 | B1 | 1/2020 | Vodrahalli | H01L 27/18 |
| 10,540,604 | B1 | 1/2020 | Papageorge | G06N 20/00 |
| 10,565,515 | B2* | 2/2020 | Lampert | H01L 23/24 |
| 10,615,160 | B2* | 4/2020 | Roberts | H01L 29/775 |
| 10,635,990 | B1* | 4/2020 | Park | G11C 27/024 |
| 10,644,113 | B2* | 5/2020 | Clarke | H01L 29/423 |
| 10,650,324 | B1* | 5/2020 | Rigetti | G06F 15/16 |
| 10,785,891 | B1* | 9/2020 | Monroe | H05K 1/0203 |
| 2010/0241780 | A1* | 9/2010 | Friesen | G06N 10/00 710/305 |
| 2013/0196855 | A1* | 8/2013 | Poletto | H01L 39/04 505/170 |
| 2013/0264617 | A1 | 10/2013 | Joshi et al. | |
| 2016/0254434 | A1* | 9/2016 | McDermott, III | H01L 39/045 505/170 |
| 2016/0300155 | A1* | 10/2016 | Betz | H01L 39/025 |
| 2017/0257074 | A1* | 9/2017 | Yeh | H01P 5/185 |
| 2018/0102470 | A1* | 4/2018 | Das | H01L 23/5384 |
| 2018/0232653 | A1* | 8/2018 | Selvanayagam | H01L 39/025 |
| 2018/0260245 | A1* | 9/2018 | Smith | G06F 9/4881 |
| 2018/0260730 | A1* | 9/2018 | Reagor | H03K 19/195 |
| 2018/0260732 | A1* | 9/2018 | Bloom | H03K 19/195 |
| 2018/0294401 | A1* | 10/2018 | Tuckerman | H01B 12/02 |
| 2019/0006572 | A1* | 1/2019 | Falcon | H01L 39/223 |
| 2019/0007051 | A1* | 1/2019 | Sete | H03K 19/195 |
| 2019/0027800 | A1* | 1/2019 | El Bouayadi | H05K 1/147 |
| 2019/0042964 | A1 | 2/2019 | Elsherbini et al. | |
| 2019/0042967 | A1 | 2/2019 | Yoscovits et al. | |
| 2019/0042968 | A1 | 2/2019 | Lampert et al. | |
| 2019/0043822 | A1 | 2/2019 | Falcon et al. | |
| 2019/0043919 | A1 | 2/2019 | George et al. | |
| 2019/0043950 | A1 | 2/2019 | George et al. | |
| 2019/0043951 | A1 | 2/2019 | Thomas et al. | |
| 2019/0043952 | A1 | 2/2019 | Thomas et al. | |
| 2019/0043953 | A1 | 2/2019 | George et al. | |
| 2019/0043955 | A1 | 2/2019 | George et al. | |
| 2019/0043968 | A1 | 2/2019 | Lampert et al. | |
| 2019/0043973 | A1 | 2/2019 | George et al. | |
| 2019/0043974 | A1 | 2/2019 | Thomas et al. | |
| 2019/0043975 | A1 | 2/2019 | George et al. | |
| 2019/0043989 | A1 | 2/2019 | Thomas et al. | |
| 2019/0044044 | A1 | 2/2019 | Lampert et al. | |
| 2019/0044045 | A1 | 2/2019 | Thomas et al. | |
| 2019/0044046 | A1 | 2/2019 | Caudillo et al. | |
| 2019/0044047 | A1* | 2/2019 | Elsherbini | G06N 10/00 |
| 2019/0044048 | A1* | 2/2019 | George | H01L 39/228 |
| 2019/0044049 | A1* | 2/2019 | Thomas | B82Y 10/00 |
| 2019/0044050 | A1* | 2/2019 | Pillarisetty | H01L 39/045 |
| 2019/0044051 | A1* | 2/2019 | Caudillo | H01L 39/025 |
| 2019/0044066 | A1 | 2/2019 | Thomas et al. | |
| 2019/0044668 | A1 | 2/2019 | Elsherbini et al. | |
| 2019/0131511 | A1 | 5/2019 | Clarke et al. | |
| 2019/0140073 | A1 | 5/2019 | Pillarisetty et al. | |
| 2019/0148530 | A1 | 5/2019 | Pillarisetty et al. | |
| 2019/0157393 | A1 | 5/2019 | Roberts et al. | |
| 2019/0164077 | A1 | 5/2019 | Roberts et al. | |
| 2019/0164959 | A1 | 5/2019 | Thomas et al. | |
| 2019/0165152 | A1 | 5/2019 | Roberts et al. | |
| 2019/0181256 | A1 | 6/2019 | Roberts et al. | |
| 2019/0194016 | A1 | 6/2019 | Roberts et al. | |
| 2019/0198618 | A1 | 6/2019 | George et al. | |
| 2019/0206991 | A1 | 7/2019 | Pillarisetty et al. | |
| 2019/0206992 | A1 | 7/2019 | George et al. | |
| 2019/0206993 | A1 | 7/2019 | Pillarisetty et al. | |
| 2019/0207075 | A1* | 7/2019 | Megrant | H01F 6/04 |
| 2019/0214385 | A1 | 7/2019 | Roberts et al. | |
| 2019/0221659 | A1 | 7/2019 | George et al. | |
| 2019/0229188 | A1 | 7/2019 | Clarke et al. | |
| 2019/0229189 | A1 | 7/2019 | Clarke et al. | |
| 2019/0252377 | A1 | 8/2019 | Clarke et al. | |
| 2019/0252536 | A1 | 8/2019 | George et al. | |
| 2019/0259850 | A1 | 8/2019 | Pillarisetty et al. | |
| 2019/0266511 | A1 | 8/2019 | Pillarisetty et al. | |
| 2019/0267692 | A1 | 8/2019 | Roberts et al. | |
| 2019/0273197 | A1 | 9/2019 | Roberts et al. | |
| 2019/0288176 | A1 | 9/2019 | Yoscovits et al. | |
| 2019/0296214 | A1 | 9/2019 | Yoscovits et al. | |
| 2019/0305037 | A1 | 10/2019 | Michalak et al. | |
| 2019/0305038 | A1 | 10/2019 | Michalak et al. | |
| 2019/0312128 | A1 | 10/2019 | Roberts et al. | |
| 2019/0334020 | A1 | 10/2019 | Amin et al. | |
| 2019/0341459 | A1 | 11/2019 | Pillarisetty et al. | |
| 2019/0341540 | A1* | 11/2019 | Megrant | H01L 39/08 |
| 2019/0363181 | A1 | 11/2019 | Pillarisetty et al. | |
| 2019/0363239 | A1 | 11/2019 | Yoscovits et al. | |
| 2019/0392352 | A1 | 12/2019 | Lampert | |
| 2020/0076034 | A1* | 3/2020 | Abdo | H03H 7/0115 |
| 2020/0136007 | A1* | 4/2020 | Gumann | H01L 39/045 |
| 2020/0265334 | A1* | 8/2020 | Haider | H01L 29/66977 |

FOREIGN PATENT DOCUMENTS

| | | |
|---|---|---|
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018063139 A1 | 4/2018 |
| WO | 2018063168 A1 | 4/2018 |
| WO | 2018063170 A1 | 4/2018 |
| WO | 2018063202 A1 | 4/2018 |
| WO | 2018063203 A1 | 4/2018 |
| WO | 2018063205 A1 | 4/2018 |
| WO | 2018106215 A1 | 6/2018 |
| WO | 2018118098 A1 | 6/2018 |
| WO | 2018143986 A1 | 8/2018 |
| WO | 2018160184 A1 | 9/2018 |
| WO | 2018160185 A1 | 9/2018 |
| WO | 2018160187 A1 | 9/2018 |
| WO | 2018164656 A1 | 9/2018 |
| WO | 2018182571 A1 | 10/2018 |
| WO | 2018182584 A1 | 10/2018 |
| WO | 2018200006 A1 | 11/2018 |
| WO | 2018231212 A1 | 12/2018 |
| WO | 2018231241 A1 | 12/2018 |
| WO | 2018236374 A1 | 12/2018 |
| WO | 2018236403 A1 | 12/2018 |

(56) References Cited

FOREIGN PATENT DOCUMENTS

| WO | 2018236404 A1 | 12/2018 |
|---|---|---|
| WO | 2018236405 A1 | 12/2018 |
| WO | 2019004990 A1 | 1/2019 |
| WO | 2019004991 A1 | 1/2019 |
| WO | 2019032114 A1 | 2/2019 |
| WO | 2019032115 A1 | 2/2019 |
| WO | 2019055038 A1 | 3/2019 |
| WO | 2019066840 A1 | 4/2019 |
| WO | 2019066843 A1 | 4/2019 |
| WO | 2019117883 A1 | 6/2019 |
| WO | 2019117929 A1 | 6/2019 |
| WO | 2019117930 A1 | 6/2019 |
| WO | 2019117972 A1 | 6/2019 |
| WO | 2019117973 A1 | 6/2019 |
| WO | 2019117974 A1 | 6/2019 |
| WO | 2019117975 A1 | 6/2019 |
| WO | 2019117977 A1 | 6/2019 |
| WO | 2019125348 A1 | 6/2019 |
| WO | 2019125423 A1 | 6/2019 |
| WO | 2019125456 A1 | 6/2019 |
| WO | 2019125498 A1 | 6/2019 |
| WO | 2019125499 A1 | 6/2019 |
| WO | 2019125500 A1 | 6/2019 |
| WO | 2019125501 A1 | 6/2019 |
| WO | 2019132963 A1 | 7/2019 |
| WO | 2019133027 A1 | 7/2019 |
| WO | 2019135769 A1 | 7/2019 |
| WO | 2019135770 A1 | 7/2019 |
| WO | 2019135771 A1 | 7/2019 |

OTHER PUBLICATIONS

"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Independent, extensible control of same-frequency superconducting qubits by selective broadcasting," Asaad et al., Netherlands Organisation for Applied Scientific Research, Aug. 28, 2015, 17 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.

"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Received Jul. 7, 2010: Published Nov. 5, 2010, 3 pages.
"Surface loss simulations of superconducting coplanar waveguide resonators," Wenner et. al, Applied Physics Letters 99, 113513 (2011), pp. 113513-1 through 3.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology,". Mistry et al., Portland Technology Department, TCAD, Intel Corp., Jul. 2004; 2 pages.
Supplementary Information, retrieved from www.nature.com, doi:10.1038/nature 15263, Oct. 5, 2015; 8 pages.
"Magnetic field tuning of coplanar waveguide resonators," Healey, et al., Applied Physics. Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Review: Towards Spintronic Quantum Technologies with Dopants in Silicon," Morley, Gavin, Department of Physics, University of Warwich, Jul. 23, 2014; 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al, Netherlands Organisation for Applied Scientific Research, Dec. 28, 2016, 9 pages.
"Defect reduction of selective Ge epitaxy in trenches on Si(001) substrates using aspect ratio trapping," Park et al., Applied Physics Letter 90, 052113 (2007), pp. 052113-1 through 3.
"Photon- and phonon-assisted tunneling in the three-dimensional charge stability diagram of a triple quantum dot array," Braakman et al., Applied Physics Letters 102, 112110. (2013), pp. 112110-1 through 4 (5 pages with cover sheet).
"Radio frequency measurements of tunnel couplings and singlet-triplet spin states in Si:P quantum dots," House et al., Nature Communications, 6:884, DOI: 10.1038/ncomms9848, published Nov. 9, 2015; pp. 1-6.
"Detecting bit-flip errors in a logical qubit using stabilizer measurements," Riste et al., Nature Communications, 6:6983, DOI: 10.1038/ncomms7983, published Apr. 29, 2015; pp. 1-6.
"Scalable gate architecture for densely packed semiconductor spin qubits," Zajac et al, Department of Physics, Princeton University; Sandia National Laboratories, Jul. 24, 2016; 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 3.
"Single-shot read-out of an individual electron spin in a quantum dot," Elzerman et al., Nature, vol. 430, Jul. 22, 2004, pp. 431-435.
"Suspending superconducting qubits by silicon micromachining," Chu et al., Department of Applied Physics, Yale University, Jun. 10, 2016, 10 pages.

(56) References Cited

OTHER PUBLICATIONS

"Single-charge tunneling in ambipolar silicon quantum dots," Müller, Filipp, Dissertation, University of Twente, Jun. 19, 2015, 148 pages.
"An addressable quantum dot qubit with fault-tolerant control-fidelity," Veldhorst et al., Nature Nanotechnology vol. 9, Dec. 2014, pp. 981-985.

* cited by examiner

INTEGRATED QUANTUM CIRCUIT ASSEMBLIES FOR COOLING APPARATUS

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being below 100. One of the main challenges resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which is thought to help minimize qubit decoherence. Providing signals to quantum circuit components with such qubits is not a trivial task and further improvements would be desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
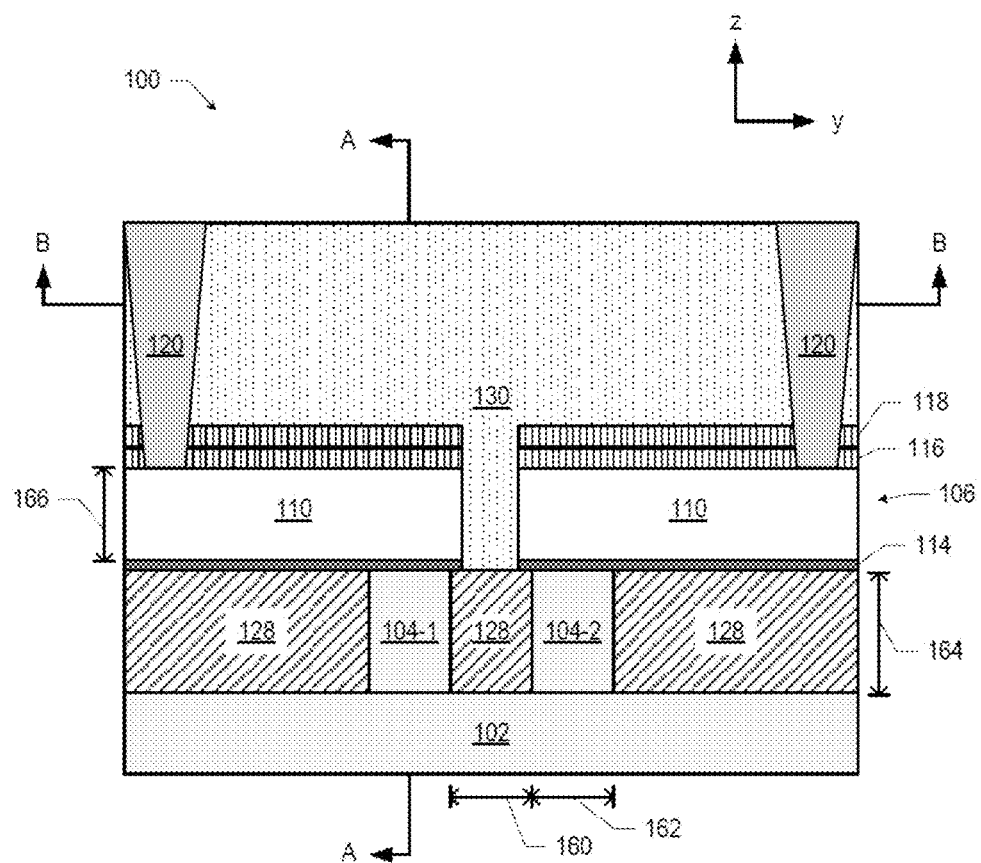
FIGS. 1-3 are cross-sectional views of an example device implementing quantum dot qubits, according to some embodiments of the present disclosure.

As briefly described above, quantum computing, or quantum information processing, refers to the field of research related to computation systems that use quantum-mechanical phenomena to store and manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. So for example, two entangled qubits are now represented by a superposition of 4 quantum states, and N entangled qubits are represented by a superposition of $2^N$ quantum states. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e. by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e. computers that use phenomena of classical physics).

Furthermore, as briefly described above, for the reason of protecting fragile qubits from decoherence, they are often operated at cryogenic temperatures by being placed in a suitable cooling apparatus, e.g., a dilution refrigerator. This raises challenges from accurate estimation and control of the temperatures to providing various signals to qubit devices which must be kept at such low temperatures.

None of the challenges described above ever had to be addressed for classical computers, and these challenges are not easy. In particular, getting a quantum circuit component that includes at least one, but typically a plurality, of qubit devices (or, simply, qubits), to operate within a cooling apparatus is far from trivial. Various other electronics, such as attenuators, directional couplers, amplifiers, custom shielding, cryogenic hardware, and others, all require significant effort to integrate into a working system. In addition, an intricate web of radio frequency (RF) and direct current (DC) cables/wires needs to be carefully routed to interconnect different components. Each time a new quantum circuit components needs to be brought it, or taken out of, a cooling apparatus, a lot of work connecting and disconnecting various electronic components and cables is involved. In addition, switching from using one cooling apparatus to another is not an easy task in terms of the amount of reconfiguration needed to include a quantum circuit component in a new cooling apparatus.

Embodiments of the present disclosure describe integrated quantum circuit assemblies that include quantum circuit components pre-packaged, or integrated, with some other electronic components and mechanical attachment means for easy inclusion within a cooling apparatus. An example integrated quantum circuit assembly includes a package and mechanical attachment means for securing the package within a cryogenic chamber of a cooling apparatus (e.g., a cryogenic refrigeration system such as a dilution refrigerator). The package includes a plurality of components that are integral (i.e., included as a part of a whole, rather than supplied separately) to the package. The plurality of components include a quantum circuit component having at least one qubit device (herein, the terms "qubit device" and "qubit" may be used interchangeably), an attenuator that is coupled to the quantum circuit component, and a directional coupler, also coupled to the quantum circuit component. In some embodiments, the plurality of components that are integral to the package may further include RF and DC cables, as needed to interconnect various ones of these components. Such an integrated assembly may significantly speed up installation of a complete quantum computer because multiple components, possibly with the necessary routing between them, may be placed into, and taken out from, a cooling apparatus at once, as a whole. Furthermore, such an integrated assembly may help develop systems for rapidly bringing up quantum computers, enable sharing of quantum hardware between different institutions, and develop into a standard product.

In various embodiments, quantum circuit component(s) integrated within a package of an integrated quantum circuit assembly for inclusion within a cooling apparatus as described herein may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the IC. The IC may be employed as part of a chipset for executing one or more related functions in a quantum system.

Some descriptions are provided with reference to quantum dot qubits and to superconducting qubits, in particular to transmons, a particular class of superconducting qubits. However, at least some teachings of the present disclosure may be applicable to implementations of quantum circuit components with any qubits, e.g., including superconducting qubits other than transmons and/or including qubits other than superconducting qubits and quantum dot qubits, which may be integrated within a package of an integrated quantum circuit assembly for inclusion within a cooling apparatus, all of which implementations being within the scope of the present disclosure. Furthermore, in some embodiments, the quantum circuit components described herein may implement hybrid semiconducting-superconducting quantum circuits.

In order to provide substantially lossless connectivity to, from, and between the qubits, some or all of the electrically conductive portions of quantum circuit assemblies described herein, in particular various conductors or cables described herein (e.g., conductors or cables integrated within a package of an integrated quantum circuit assembly for inclusion within a cooling apparatus), as well as other components of quantum circuits, may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive/superconducting materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g. scanning electron microscopy (SEM) images or transmission electron microscope (TEM) images. In such images of real structures, possible processing defects could also be visible, such as not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−5-20% of a target value based on the context of a particular value as described herein or as known in the art. Similarly, terms indicating orientation of various elements, such as e.g. "coplanar," "perpendicular," "orthogonal," "parallel," or any other angle between the elements, generally refer to being within +/−5-20% of a target value based on the context of a particular value as described herein or as known in the art.

Furthermore, as used herein, terms indicating what may be considered an idealized behavior, such as e.g. "lossless" (or "low-loss") or "superconductive/superconducting," are intended to cover functionality that may not be exactly ideal but is within acceptable margins for a given application. For example, a certain level of loss, either in terms of nonzero electrical resistance or nonzero amount of spurious two-level systems may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range of the RF spectrum is higher than thermal excitations at the temperature that qubits are typically operated at. In addition, techniques for the control and measurement of microwaves are well known. For these reasons, typical frequencies of qubits are in 1-30 GHz, e.g. in 3-10 GHz range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Integrated Quantum Circuit Assemblies with Various Types of Qubits

As described above, the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include e.g. semiconducting qubits including those made using quantum dots (e.g., spin qubits and charge qubits), superconducting qubits (e.g. flux qubits or transmon qubits, the latter sometimes simply referred to as "transmons"), photon polarization qubits, single trapped ion qubits, etc. To indicate that these devices implement qubits, sometimes these devices are referred to as qubits, e.g. quantum dot qubits, superconducting qubits, etc.

Figure 13:
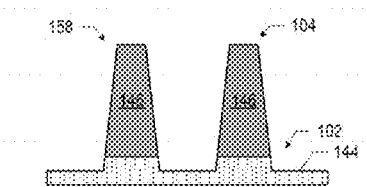
Figure 14:
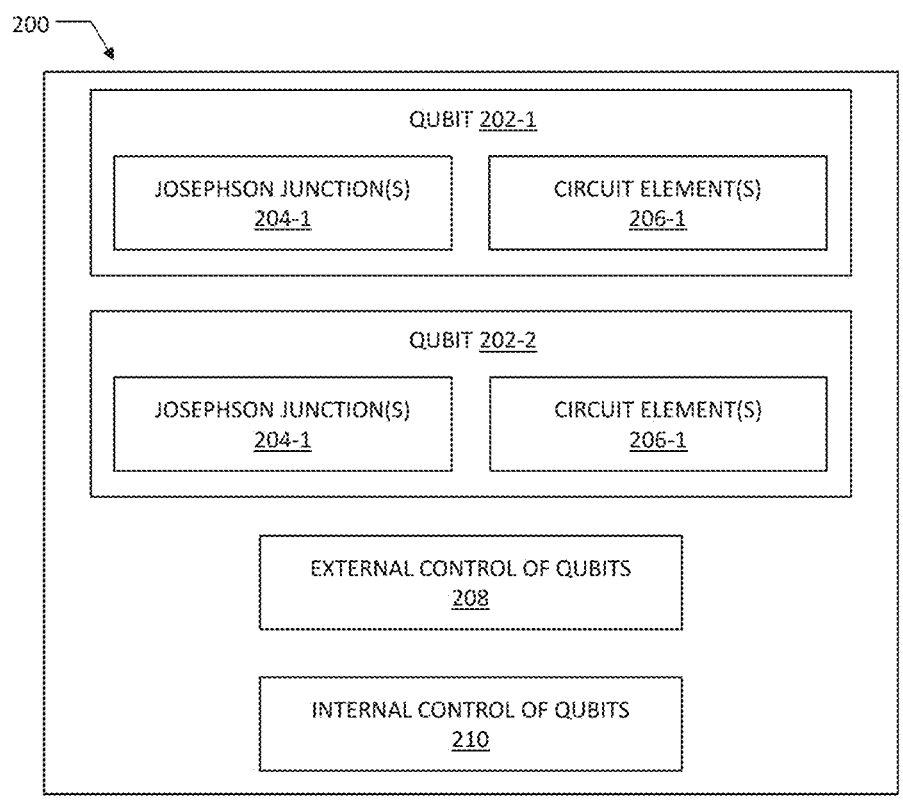
FIG. 14 provides a schematic illustration of an example device implementing superconducting qubits, according to some embodiments of the present disclosure.
Figure 15:
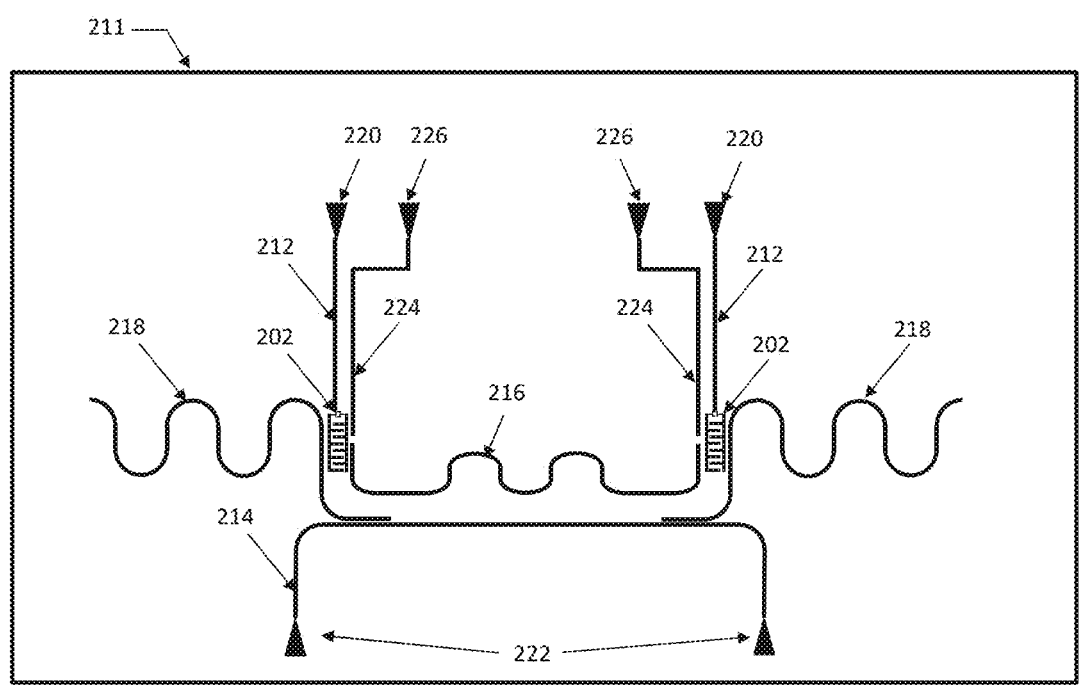
FIG. 15 provides a schematic illustration of an example physical layout of a device implementing superconducting qubits, according to some embodiments of the present disclosure.

The type of qubits used in a quantum circuit component would affect what types of signals are to be provided to or received from a package described herein in which such a quantum circuit component is included, with the package being placed in a cooling apparatus for operation. Below, two example quantum circuit components are described—one incorporating quantum dot qubits (FIGS. 1-13) and one incorporating superconducting qubits (FIGS. 14-15). However, integration, package within a cooling apparatus, of a package that includes a plurality of components that are integral to the as described herein is applicable to quantum circuit components that include any type of qubits, all of which being within the scope of the present disclosure.

Example Quantum Circuit Components with Quantum Dot Qubits

Quantum dot devices may enable the formation of quantum dots to serve as quantum bits (i.e. as qubits) in a quantum computing device. One type of quantum dot devices includes devices having a base, a fin extending away from the base, where the fin includes a quantum well layer, and one or more gates disposed on the fin. A quantum dot formed in such a device may be constrained in the x-direction by the one or more gates, in the y-direction by the fin, and in the z-direction by the quantum well layer, as discussed in detail herein. Unlike previous approaches to quantum dot formation and manipulation, quantum dot devices with fins provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this is the type of a qubit device that is described as a first example qubit device that may be used in a quantum circuit component to be integrated in a package with other electronic components to be operated and/or tested in a cooling apparatus as described herein, according to some embodiments of the present disclosure.

Figure 2:
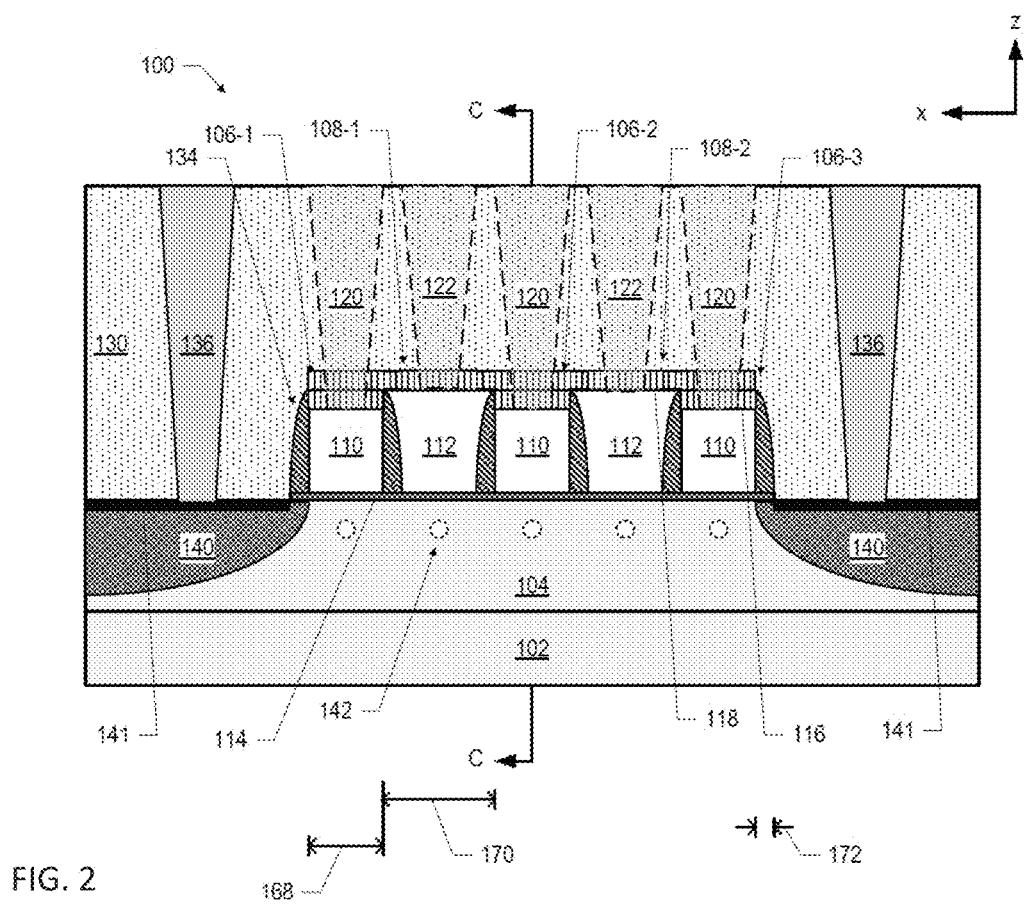
Figure 3:
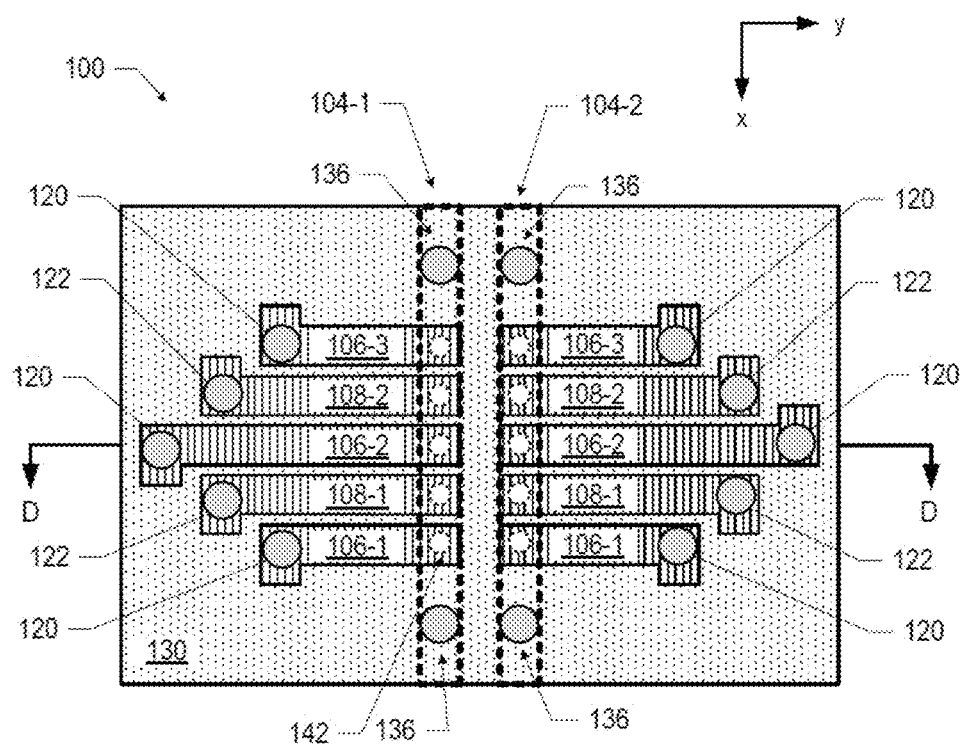

FIGS. 1-3 are cross-sectional views of an example quantum dot device 100 implementing quantum dot qubits, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), and FIG. 3 illustrates the quantum dot device 100 taken along the section B-B of FIG. 1 (while FIG. 1 illustrates a quantum dot device 100 taken along the section D-D of FIG. 3). Although FIG. 1 indicates that the cross-section illustrated in FIG. 2 is taken through the fin 104-1, an analogous cross-section taken through the fin 104-2 may be identical, and thus the discussion of FIGS. 1-3 refers generally to the "fin 104."

A quantum circuit component to be operated and/or tested within a cooling apparatus after being placed into the cooling apparatus as an integral part of a package that further includes other electronic components, as described herein, may include one or more of the quantum dot devices 100.

As shown in FIGS. 1-3, the quantum dot device 100 may include a base 102 and multiple fins 104 extending away from the base 102. The base 102 and the fins 104 may include a semiconductor substrate and a quantum well stack (not shown in FIGS. 1-3, but discussed below with reference to the semiconductor substrate 144 and the quantum well stack 146), distributed in any of a number of ways between the base 102 and the fins 104. The base 102 may include at least some of the semiconductor substrate, and the fins 104 may each include a quantum well layer of the quantum well stack (discussed below with reference to the quantum well layer 152 of FIGS. 4-6). Examples of base/fin arrangements are discussed below with reference to the base fin arrangements 158 of FIGS. 7-13.

Although only two fins, 104-1 and 104-2, are shown in FIGS. 1-3, this is simply for ease of illustration, and more than two fins 104 may be included in the quantum dot device 100. In some embodiments, the total number of fins 104 included in the quantum dot device 100 is an even number, with the fins 104 organized into pairs including one active fin 104 and one read fin 104, as discussed in detail below. When the quantum dot device 100 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 104 for ease of illustration, but all the teachings of the present disclosure apply to quantum dot devices 100 with more fins 104.

As noted above, each of the fins 104 may include a quantum well layer (not shown in FIGS. 1-3, but discussed below with reference to the quantum well layer 152). The quantum well layer included in the fins 104 may be arranged normal to the z-direction, and may provide a layer in which a two-dimensional electron gas (2DEG) may form to enable the generation of a quantum dot during operation of the quantum dot device 100, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 162 between 10 and 30 nanometers. In some embodiments, the fins 104 may each have a height 164 between 200 and 400 nanometers (e.g., between 250 and 350 nanometers, or equal to 300 nanometers).

The fins 104 may be arranged in parallel, as illustrated in FIGS. 1 and 3, and may be spaced apart by an insulating material 128, which may be disposed on opposite faces of the fins 104. The insulating material 128 may be a dielectric material, such as silicon oxide. For example, in some embodiments, the fins 104 may be spaced apart by a distance 160 between 100 and 250 microns.

Multiple gates may be disposed on each of the fins 104. In the embodiment illustrated in FIG. 2, three gates 106 and two gates 108 are shown as distributed on the top of the fin 104. This particular number of gates is simply illustrative, and any suitable number of gates may be used. Additionally, multiple groups of gates like the gates illustrated in FIG. 2 may be disposed on the fin 104.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114. In the embodiment illustrated in FIG. 2, the gate dielectric 114 for all of the gates 106/108 is provided by a common layer of gate dielectric material. In other embodiments, the gate dielectric 114 for each of the gates 106/108 may be provided by separate portions of gate dielectric 114. In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 and a hardmask 116. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 2 for ease of illustration. In some embodiments, the gate metal 110 may be a superconductor, such as aluminum, titanium nitride (e.g., deposited via atomic layer deposition), or niobium titanium nitride. In some embodiments, the hardmask 116 may not be present in the quantum dot device 100 (e.g., a hardmask like the hardmask 116 may be removed during processing, as discussed below). The sides of the gate metal 110 may be substantially parallel, as shown in FIG. 2, and insulating spacers 134 may be disposed on the sides of the gate metal 110 and the hardmask 116. As illustrated in FIG. 2, the spacers 134 may be thicker closer to the fin 104 and thinner farther away from the fin 104. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 110 may be any suitable metal, such as titanium nitride.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the fin 104. In the embodiment illustrated in FIG. 2, the hardmask 118 may extend over the hardmask 116 (and over the gate metal 110 of the gates 106), while in other embodiments, the hardmask 118 may not extend over the gate metal 110 (e.g., as discussed below with reference to FIG. 45). In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via atomic layer deposition), or niobium titanium nitride. In some embodiments, the hardmask 118 may not be present in the quantum dot device 100 (e.g., a hardmask like the hardmask 118 may be removed during processing, as discussed below).

The gate 108 may extend between the proximate spacers 134 on the sides of the gate 106-1 and the gate 106-3, as shown in FIG. 2. In some embodiments, the gate metal 112 may extend between the spacers 134 on the sides of the gate 106-1 and the gate 106-3. Thus, the gate metal 112 may have a shape that is substantially complementary to the shape of the spacers 134, as shown. In some embodiments in which the gate dielectric 114 is not a layer shared commonly between the gates 108 and 106, but instead is separately deposited on the fin 104 between the spacers 134 (e.g., as discussed below with reference to FIGS. 40-44), the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 may take any suitable values. For example, in some embodiments, the z-height 166 of the gate metal 110 may be between 40 and 75 nanometers (e.g., approximately 50 nanometers); the z-height of the gate metal 112 may be in the same range. In embodiments like the ones illustrated in FIG. 2, the z-height of the gate metal 112 may be greater than the z-height of the gate metal 110. In some embodiments, the length 168 of the gate metal 110 (i.e., in the x-direction) may be between 20 and 40 nanometers (e.g., 30 nanometers). In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between 40 and 60 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 2. As indicated in FIG. 1, the gates 106/108 on one fin 104 may extend over the insulating material 128 beyond their respective fins 104 and towards the other fin 104, but may be isolated from their counterpart gates by the intervening insulating material 130.

As shown in FIG. 2, the gates 106 and 108 may be alternatingly arranged along the fin 104 in the x-direction. During operation of the quantum dot device 100, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 2 and 3 for ease of illustration, but five are indicated as dotted circles in each fin 104, forming what may be referred to as a "quantum dot array." The location of the quantum dots 142 in FIG. 2 is not intended to indicate a particular geometric positioning of the quantum dots 142. The spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable material; for example, in embodiments in which the doped region 140 includes silicon, the interface material 141 may include nickel silicide.

The quantum dot devices 100 disclosed herein may be used to form electron-type or hole-type quantum dots 142. Note that the polarity of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under a gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 1-3, the gates 106 may extend away from the fins 104, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may extend away from the fins 104, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired.

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The conductive vias 120, 122, and 136 may be electrically isolated from each other by an insulating material 130. The insulating material 130 may be any suitable material, such as an interlayer dielectric (ILD). Examples of the insulating material 130 may include silicon oxide, silicon nitride, aluminum oxide, and/or silicon oxynitride. As known in the art of IC manufacturing, conductive vias and lines may be formed in an iterative process in which layers of structures are formed on top of each other. In some embodiments, the conductive vias 120/122/136 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 1-3 is simply illustrative, and any electrical routing arrangement may be implemented.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 100 enables both quantum computation and the ability to read the results of a quantum computation.

Although not specifically shown in FIGS. 1-3, the quantum dot device 100 may further include one or more accumulation gates used to form a 2DEG in the quantum well area between the area with the quantum dots and the reservoir such as e.g. the doped regions 140 which, as previously described, may serve as a reservoir of charge carriers for the quantum dot device 100. Using such accumulation gates may allow to reduce the number of charge carriers in the area adjacent to the area in which quantum dots are to be formed, so that single charge carriers can be transferred from the reservoir into the quantum dot array. In various embodiments, an accumulation gate may be implemented on either side of an area where a quantum dot is to be formed.

Although also not specifically shown in FIGS. 1-3, some implementations of the quantum dot device 100 further include or are coupled to a magnetic field source used for spin manipulation of the charge carriers in the quantum dots. In various embodiments, e.g. a microwave transmission line or one or more magnets with pulsed gates may be used as a magnetic field source. Once a quantum dot array is initialized by ensuring that a desired number of charge carriers are present in each quantum dot and ensuring the initial spins of these charge carriers, spin manipulation may be carried out with either a single spin or pairs of spin or possibly larger numbers of spins. In some embodiments, single spins may be manipulated using electron spin resonance with a rotating magnetic field (perpendicular to its static field) and on resonance with the transition energy at which the spin flips.

Figure 4:
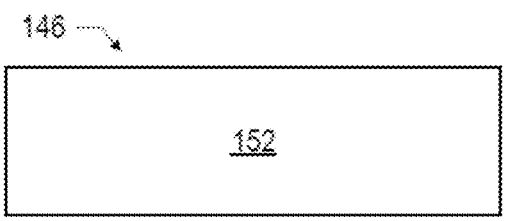
FIGS. 4-6 are cross-sectional views of various examples of quantum well stacks that may be used in a quantum dot device, according to some embodiments of the present disclosure.
Figure 5:
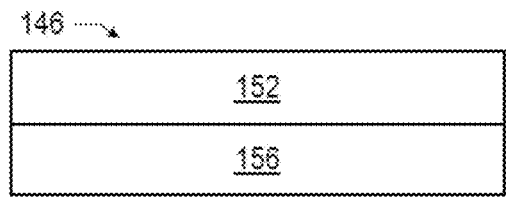
Figure 6:
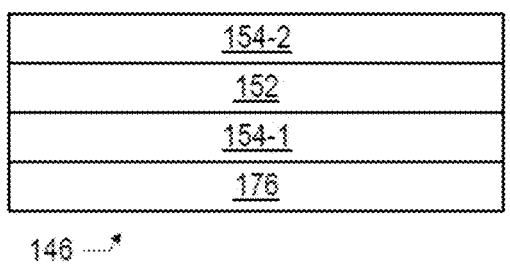

As discussed above, the base 102 and the fin 104 of a quantum dot device 100 may be formed from a semiconductor substrate 144 and a quantum well stack 146 disposed on the semiconductor substrate 144. The quantum well stack 146 may include a quantum well layer in which a 2DEG may form during operation of the quantum dot device 100. The quantum well stack 146 may take any of a number of forms, several of which are illustrated in FIGS. 4-6. The various layers in the quantum well stacks 146 discussed below may be grown on the semiconductor substrate 144 (e.g., using epitaxial processes).

FIG. 4 is a cross-sectional view of a quantum well stack 146 including only a quantum well layer 152. The quantum well layer 152 may be disposed on the semiconductor substrate 144, and may be formed of a material such that, during operation of the quantum dot device 100, a 2DEG may form in the quantum well layer 152 proximate to the upper surface of the quantum well layer 152. The gate dielectric 114 of the gates 106/108 may be disposed on the upper surface of the quantum well layer 152. In some embodiments, the quantum well layer 152 of FIG. 4 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. In some such embodiments, the intrinsic silicon may be strained, while in other embodiments, the intrinsic silicon may not be strained. The thicknesses (i.e., z-heights) of the layers in the quantum well stack 146 of FIG. 4 may take any suitable values. For example, in some embodiments, the thickness of the quantum well layer 152 (e.g., intrinsic silicon) may be between 0.8 and 1.2 microns.

FIG. 5 is a cross-sectional view of a quantum well stack 146 including a quantum well layer 152 and a barrier layer 154. The quantum well stack 146 may be disposed on a semiconductor substrate 144 such that the barrier layer 154 is disposed between the quantum well layer 152 and the semiconductor substrate 144. The barrier layer 154 may provide a potential barrier between the quantum well layer 152 and the semiconductor substrate 144. As discussed above with reference to FIG. 4, the quantum well layer 152 of FIG. 5 may be formed of a material such that, during operation of the quantum dot device 100, a 2DEG may form in the quantum well layer 152 proximate to the upper surface of the quantum well layer 152. For example, in some embodiments in which the semiconductor substrate 144 is formed of silicon, the quantum well layer 152 of FIG. 5 may be formed of silicon, and the barrier layer 154 may be formed of silicon germanium. The germanium content of this silicon germanium may be 20-80% (e.g., 30%). The thicknesses (i.e., z-heights) of the layers in the quantum well stack 146 of FIG. 5 may take any suitable values. For example, in some embodiments, the thickness of the barrier layer 154 (e.g., silicon germanium) may be between 0 and 400 nanometers. In some embodiments, the thickness of the quantum well layer 152 (e.g., silicon) may be between 5 and 30 nanometers.

FIG. 6 is a cross-sectional view of a quantum well stack 146 including a quantum well layer 152 and a barrier layer 154-1, as well as a buffer layer 176 and an additional barrier layer 154-2. The quantum well stack 146 may be disposed on the semiconductor substrate 144 such that the buffer layer 176 is disposed between the barrier layer 154-1 and the semiconductor substrate 144. The buffer layer 176 may be formed of the same material as the barrier layer 154, and may be present to trap defects that form in this material as it is grown on the semiconductor substrate 144. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the semiconductor substrate 144 to the barrier layer 154-1. For example, the silicon germanium of the buffer layer 176 may have a germanium content that varies from zero percent at the silicon semiconductor substrate 144 to a nonzero percent (e.g., 30%) at the barrier layer 154-1. The thicknesses (i.e., z-heights) of the layers in the quantum well stack 146 of FIG. 6 may take any suitable values. For example, in some embodiments, the thickness of the buffer layer 176 (e.g., silicon germanium) may be between 0.3 and 4 microns (e.g., 0.3-2 microns, or 0.5 microns). In some embodiments, the thickness of the barrier layer 154-1 (e.g., silicon germanium) may be between 0 and 400 nanometers. In some embodiments, the thickness of the quantum well layer 152 (e.g., silicon) may be between 5 and 30 nanometers (e.g., 10 nanometers). In some embodiments, the thickness of the barrier layer 154-2 (e.g., silicon germanium) may be between 25 and 75 nanometers (e.g., 32 nanometers).

As discussed above with reference to FIG. 5, the quantum well layer 152 of FIG. 6 may be formed of a material such that, during operation of the quantum dot device 100, a 2DEG may form in the quantum well layer 152 proximate to the upper surface of the quantum well layer 152. For example, in some embodiments in which the semiconductor substrate 144 is formed of silicon, the quantum well layer 152 of FIG. 6 may be formed of silicon, and the barrier layer 154-1 and the buffer layer 176 may be formed of silicon germanium. In some such embodiments, the silicon germanium of the buffer layer 176 may have a germanium content that varies from the semiconductor substrate 144 to the barrier layer 154-1. For example, the silicon germanium of the buffer layer 176 may have a germanium content that varies from zero percent at the silicon semiconductor substrate 144 to a nonzero percent (e.g., 30%) at the barrier layer 154-1. The barrier layer 154-1 may in turn have a germanium content equal to the nonzero percent. In other embodiments, the buffer layer 176 may have a germanium content equal to the germanium content of the barrier layer 154-1, but may be thicker than the barrier layer 154-1 so as to absorb the defects that may arise during growth. The barrier layer 154-2, like the barrier layer 154-1, may provide a potential energy barrier around the quantum well layer 152, and may take the form of any of the embodiments of the barrier layer 154-1. In some embodiments of the quantum well stack 146 of FIG. 6, the buffer layer 176 and/or the barrier layer 154-2 may be omitted.

The semiconductor substrate 144 and the quantum well stack 146 may be distributed between the base 102 and the fins 104 of the quantum dot device 100, as discussed above. This distribution may occur in any of a number of ways. For example, FIGS. 7-13 illustrate example base/fin arrangements 158 that may be used in a quantum dot device 100, in accordance with various embodiments.

Figure 7:
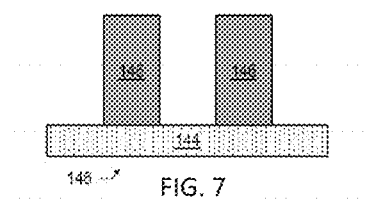
FIGS. 7-13 illustrate example base/fin arrangements that may be used in a quantum dot device, according to some embodiments of the present disclosure.

In the base/fin arrangement 158 of FIG. 7, the quantum well stack 146 may be included in the fins 104, but not in the base 102. The semiconductor substrate 144 may be included in the base 102, but not in the fins 104. Manufacturing of the base/fin arrangement 158 of FIG. 7 may include fin etching through the quantum well stack 146, stopping when the semiconductor substrate 144 is reached.

Figure 8:
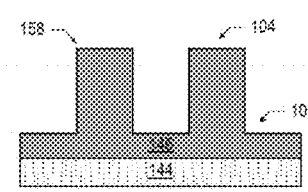
Figure 9:
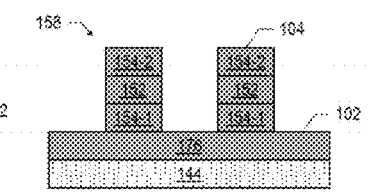

In the base/fin arrangement 158 of FIG. 8, the quantum well stack 146 may be included in the fins 104, as well as in a portion of the base 102. A semiconductor substrate 144 may be included in the base 102 as well, but not in the fins 104. Manufacturing of the base/fin arrangement 158 of FIG. 8 may include fin etching that etches partially through the quantum well stack 146, and stops before the semiconductor substrate 144 is reached. FIG. 9 illustrates a particular embodiment of the base/fin arrangement 158 of FIG. 8. In the embodiment of FIG. 9, the quantum well stack 146 of FIG. 6 is used; the fins 104 include the barrier layer 154-1, the quantum well layer 152, and the barrier layer 154-2, while the base 102 includes the buffer layer 176 and the semiconductor substrate 144.

Figure 10:
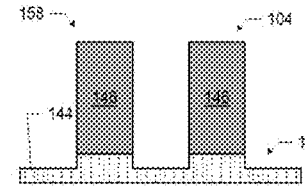
Figure 11:
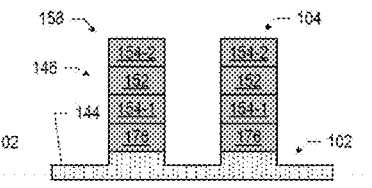

In the base/fin arrangement 158 of FIG. 10, the quantum well stack 146 may be included in the fins 104, but not the base 102. The semiconductor substrate 144 may be partially included in the fins 104, as well as in the base 102. Manufacturing the base/fin arrangement 158 of FIG. 10 may include fin etching that etches through the quantum well stack 146 and into the semiconductor substrate 144 before stopping. FIG. 11 illustrates a particular embodiment of the base/fin arrangement 158 of FIG. 10. In the embodiment of FIG. 11, the quantum well stack 146 of FIG. 6 is used; the fins 104 include the quantum well stack 146 and a portion of the semiconductor substrate 144, while the base 102 includes the remainder of the semiconductor substrate 144.

Figure 12:
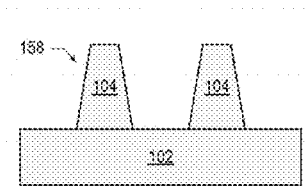

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 12, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 12. FIG. 13 illustrates a particular embodiment of the base/fin arrangement 158 of FIG. 12. In FIG. 13, the quantum well stack 146 is included in the tapered fins 104 while a portion of the semiconductor substrate 144 is included in the tapered fins and a portion of the semiconductor substrate 144 provides the base 102.

In the embodiment of the quantum dot device 100 illustrated in FIG. 2, the z-height of the gate metal 112 of the gates 108 may be approximately equal to the sum of the z-height of the gate metal 110 and the z-height of the hardmask 116, as shown. Also in the embodiment of FIG. 2, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates may extend beyond the spacers 134 in the x-direction.

Example Quantum Circuit Components with Superconducting Qubits

Superconducting qubits are also promising candidates for building a quantum computer. Therefore, these are the types of qubit devices that may be used in a second example qubit device that may be used in a quantum circuit component to be integrated in a package with other electronic components to be operated and/or tested in a cooling apparatus as described herein, according to some embodiments of the present disclosure.

As shown in FIG. 14, an example superconducting quantum circuit 200 may include two or more qubits 202 (reference numerals following after a dash, such as e.g. qubit 202-1 and 202-2 indicate different instances of the same or analogous element). All of superconducting qubits operate based on the Josephson effect, which refers to a macroscopic quantum phenomenon of supercurrent, i.e. a current that, due to zero electrical resistance, flows indefinitely long without any voltage applied, across a non-linear inductive element such as a Josephson Junction. Josephson Junctions are integral building blocks in superconducting quantum circuits where they form the basis of quantum circuit elements that can approximate functionality of theoretically designed qubits. Therefore FIG. 14 illustrates that each of the superconducting qubits 202 may include one or more Josephson Junctions 204.

In general, a Josephson Junction includes two superconductors coupled by a so-called weak link that weakens the superconductivity between the two superconductors. In some embodiments, weak links of Josephson Junctions may be implemented by providing a thin layer of an insulating material, a conductive but not superconductive material, or a semiconducting material, typically referred to as a "barrier" or a "tunnel barrier," sandwiched, in a stack-like arrangement, between two layers of superconductor, which two superconductors typically referred to, respectively, as a "first electrode" and a "second electrode" of a Josephson Junction. Josephson Junction provides a non-linear inductive element to the circuit and allows the qubit to become an anharmonic oscillator. The anharmonicity is what allows the state of the qubit to be controlled to a high level of fidelity.

Typically, when a qubit employs only one Josephson Junction, a frequency of the qubit cannot be changed substantially beyond what is defined by the design unless one of the qubit capacitive elements is tunable. Employing two or more Josephson Junctions, e.g. arranged in a so-called superconducting quantum interference device (SQUID), allows controlling the frequency of the qubit, which, in turn, allows greater control as to whether and when the qubit interacts with other components of a quantum circuit, e.g. with other qubits. In general, a SQUID of a superconducting qubit includes a pair of Josephson Junctions and a loop of a conductive, typically superconductive material (i.e. a superconducting loop), connecting a pair of Josephson Junctions. Applying a net magnetic field in a certain orientation to the SQUID loop of a superconducting qubit allows controlling the frequency of the qubit. In particular, applying magnetic field to the SQUID region of a superconducting qubit is generally referred to as a "flux control" of a qubit, and the magnetic field is generated by providing DC or a pulse of current through an electrically conductive or superconductive line generally referred to as a "flux bias line" (also known as a "flux line" or a "flux coil line"). By providing flux bias lines sufficiently close to SQUIDs, magnetic fields generated as a result of currents running through the flux bias lines extend to the SQUIDs, thus tuning qubit frequencies.

Turning back to FIG. 14, within each qubit 202, the one or more Josephson Junctions 204 may be directly electrically connected to one or more other circuit elements 206, which, in combination with the Josephson Junction(s) 204, form a non-linear oscillator circuit providing multi-level quantum system where the first two to three levels define the qubit under normal operation. The circuit elements 206 could be e.g. shunt capacitors, superconducting loops of a SQUID, electrodes for setting an overall capacitance of a qubit, or/and ports for capacitively coupling the qubit to one or more of a readout resonator, a coupling or "bus" component, and a direct microwave drive line, or electromagnetically coupling the qubit to a flux bias line.

As also shown in FIG. 14, an example superconducting quantum circuit 200 may include means 208 for providing external control of qubits 202 and means 210 for providing internal control of qubits 202. In this context, "external control" refers to controlling the qubits 202 from outside of, e.g. an IC chip comprising the qubits, including control by a user of a quantum computer, while "internal control" refers to controlling the qubits 202 within the IC chip. For example, if qubits 202 are transmons, external control may be implemented by means of flux bias lines (also known as "flux lines" and "flux coil lines") and by means of readout and drive lines (also known as "microwave lines" since qubits are typically designed to operate with microwave signals), described in greater detail below. On the other hand, internal control lines for such qubits may be implemented by means of resonators, e.g., coupling and readout resonators, also described in greater detail below.

Any one of the qubits 202, the external control means 208, and the external control means 210 of the quantum circuit 200 may be provided on, over, or at least partially embedded in a substrate (not shown in FIG. 14).

FIG. 15 provides a schematic illustration of an example physical layout of a superconducting quantum circuit 211 where qubits are implemented as transmons, according to some embodiments of the present disclosure.

Similar to FIG. 14, FIG. 15 illustrates two qubits 202. In addition, FIG. 15 illustrates flux bias lines 212, microwave lines 214, a coupling resonator 216, a readout resonator 218, and connections (e.g. wirebonding pads or any other suitable connections) 220 and 222. The flux bias lines 212 and the microwave lines 214 may be viewed as examples of the external control means 208 shown in FIG. 14. The coupling resonator 216 and the readout resonator 218 may be viewed as examples of the internal control means 210 shown in FIG. 14.

Running a current through the flux bias lines 212, provided from the connections 220, allows tuning (i.e. changing) the frequency of the corresponding qubits 202 to which each line 212 is connected. In general, it operates in the following manner. As a result of running the current in a particular flux bias line 212, magnetic field is created around the line. If such a magnetic field is in sufficient proximity to the qubit 202, e.g. by a portion of the flux bias line 212 being provided next to the qubit 202, the magnetic field couples to the qubit, thereby changing the spacing between the energy levels of the qubit. This, in turn, changes the frequency of the qubit since the frequency is directly related to the spacing between the energy levels via Planck's equation. The Planck's equation is $E=h\nu$, where E is the energy (in this case the energy difference between energy levels of a qubit), h is the Planck's constant and $\nu$ is the frequency (in this case the frequency of the qubit). As this equation illustrates, if E changes, then $\nu$ changes. Provided there is sufficient multiplexing, different currents can be sent down each of the flux lines allowing for independent tuning of the various qubits.

Typically, the qubit frequency may be controlled in order to bring the frequency either closer to or further away from another resonant item, for example a coupling resonator such as 216 shown in FIG. 15 that connects two or more qubits together, as may be desired in a particular setting.

For example, if it is desirable that a first qubit 202 (e.g. the qubit 202 shown on the left side of FIG. 15) and a second qubit 202 (e.g. the qubit 202 shown on the right side of FIG. 15) interact, via the coupling resonator 216 connecting these qubits, then both qubits 202 may need to be tuned to be at nearly the same frequency. One way in which such two qubits could interact is that, if the frequency of the first qubit 202 is tuned very close to the resonant frequency of the coupling resonator 216, the first qubit can, when in the excited state, relax back down to the ground state by emitting a photon (similar to how an excited atom would relax) that would resonate within the coupling resonator 216. If the second qubit 202 is also at this energy (i.e. if the frequency of the second qubit is also tuned very close to the resonant frequency of the coupling resonator 216), then it can absorb the photon emitted from the first qubit, via the coupling resonator 216, and be excited from its ground state to an excited state. Thus, the two qubits interact in that a state of one qubit is controlled by the state of another qubit. In other scenarios, two qubits could interact via a coupling resonator at specific frequencies, but these three elements do not have to be tuned to be at nearly the same frequency with one another. In general, two or more qubits could be configured to interact with one another by tuning their frequencies to specific values or ranges.

On the other hand, it may sometimes be desirable that two qubits coupled by a coupling resonator do not interact, i.e. the qubits are independent. In this case, by applying magnetic flux, by means of controlling the current in the appropriate flux bias line, to one qubit it is possible to cause the frequency of the qubit to change enough so that the photon it could emit no longer has the right frequency to resonate on the coupling resonator. If there is nowhere for such a frequency-detuned photon to go, the qubit will be better isolated from its surroundings and will live longer in its current state. Thus, in general, two or more qubits could be configured to avoid or eliminate interactions with one another by tuning their frequencies to specific values or ranges.

The state(s) of each qubit 202 may be read by way of its corresponding readout resonator 218. As explained below, the qubit 202 induces a resonant frequency in the readout resonator 218. This resonant frequency is then passed to the microwave lines 214 and communicated to the pads 222.

To that end, a readout resonator 218 may be provided for each qubit. The readout resonator 218 may be a transmission line that includes a capacitive connection to ground on one side and is either shorted to the ground on the other side (for a quarter wavelength resonator) or has a capacitive connection to ground (for a half wavelength resonator), which results in oscillations within the transmission line (resonance), with the resonant frequency of the oscillations being close to the frequency of the qubit. The readout resonator 218 is coupled to the qubit by being in sufficient proximity to the qubit 202, more specifically in sufficient proximity to the capacitor of the qubit 202, when the qubit is implemented as a transmon, either through capacitive or inductive coupling. Due to a coupling between the readout resonator 218 and the qubit 202, changes in the state of the qubit 202 result in changes of the resonant frequency of the readout resonator 218. In turn, because the readout resonator 218 is in sufficient proximity to the microwave line 214, changes in the resonant frequency of the readout resonator 218 induce changes in the current in the microwave line 214, and that current can be read externally via the wire bonding pads 222.

The coupling resonator 216 allows coupling different qubits together, e.g. as described above, in order to realize quantum logic gates. The coupling resonator 216 is similar to the readout resonator 218 in that it is a transmission line that includes capacitive connections to ground on both sides (i.e. a half wavelength resonator), which also results in oscillations within the coupling resonator 216. Each side of the coupling resonator 216 is coupled (again, either capacitively or inductively) to a respective qubit by being in sufficient proximity to the qubit, namely in sufficient proximity to the capacitor of the qubit, when the qubit is implemented as a transmon. Because each side of the coupling resonator 216 has coupling with a respective different qubit, the two qubits are coupled together through the coupling resonator 216. In this manner, state of one qubit depends on the state of the other qubit, and the other way around. Thus, coupling resonators may be employed in order to use a state of one qubit to control a state of another qubit.

In some implementations, the microwave line 214 may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines such as the line 214 shown in FIG. 15 may be used to only readout the state of the qubits as described above, while separate drive lines such as e.g. drive lines 224 shown in FIG. 15, may be used to control the state of the qubits. In such implementations, the microwave lines used for readout may be referred to as readout lines (e.g. readout line 214), while microwave lines used for controlling the state of the qubits may be referred to as drive lines (e.g. drive lines 224). The drive lines 224 may control the state of their respective qubits 202 by providing, using e.g. connections 226 as shown in FIG. 15, a microwave pulse at the qubit frequency, which in turn stimulates (i.e. triggers) a transition between the states of the qubit. By varying the length of this pulse, a partial transition can be stimulated, giving a superposition of the states of the qubit.

Coupling resonators and readout resonators of the superconducting quantum circuit 200 or 211 may be configured for capacitive coupling to other circuit elements at one or both ends in order to have resonant oscillations, whereas flux bias lines and microwave lines are intended to be non-resonant microwave transmission lines. In general, a resonator of a quantum circuit differs from a non-resonant microwave transmission line in that a resonator is a transmission line that is deliberately designed to support resonant oscillations (i.e. resonance) within the line, under certain conditions. In contrast, non-resonant transmission lines may be similar to conventional microwave transmission lines in that they are designed to avoid resonances, especially resonances at frequencies/wavelengths close to the resonant frequencies/wavelengths of any resonators in the proximity of such non-resonant lines. Once non-resonant transmission lines are manufactured, some of them may inadvertently support some resonances, but, during its design, efforts are taken to minimize resonances, standing waves, and reflected signals as much as possible, so that all of the signals can be transmitted through these lines without, or with as little resonance as possible. For example, the ends of non-resonant transmission lines are typically engineered to have a specific impedance (e.g. substantially 50 Ohm) to minimize impedance mismatches to other circuit elements to which the lines are connected, in order to minimize the amount of reflected signal at transitions (e.g., transitions from the chip to the package, the package to the connector, etc.).

Each one of the resonators and non-resonant transmission lines of a superconducting quantum circuit may be implemented as any suitable architecture of a microwave transmission line, such as e.g. a coplanar waveguide, a stripline, a microstrip line, or an inverted microstrip line. Typical materials to make the lines and resonators include Al, Nb, NbN, TiN, MoRe, and NbTiN, all of which are particular types of superconductors. However, in various embodiments, other suitable superconductors and alloys of superconductors may be used as well.

In various embodiments, various lines and qubits shown in FIG. 15 could have shapes and layouts different from those shown in that FIG. For example, some lines or resonators may comprise more curves and turns while other lines or resonators may comprise less curves and turns, and some lines or resonators may comprise substantially straight lines. In some embodiments, various lines or resonators may intersect one another, in such a manner that they don't make an electrical connection, which can be done by using e.g. a bridge, bridging one interconnect over the other. As long as these lines and resonators operate in accordance with use of such lines and resonators as known in the art for which some example principles were described above, quantum circuits with different shapes and layouts of the lines, resonators and qubits than those illustrated in FIG. 15 are all within the scope of the present disclosure.

While FIGS. 14 and 15 illustrate examples of quantum circuits comprising only two qubits 202, embodiments with any larger number of qubits are possible and are within the scope of the present disclosure. Furthermore, while FIGS. 14 and 15 illustrate embodiments specific to transmons, subject matter disclosed herein is not limited in this regard and may include other embodiments of quantum circuits implementing other types of superconducting qubits that would also utilize Josephson Junctions as described herein, all of which are within the scope of the present disclosure.

A quantum circuit component to be operated and/or tested within a cooling apparatus after being placed into the cooling apparatus as an integral part of a package that further includes other electronic components, as described herein, may include one or more of the superconducting qubit devices 202.

Including Integrated Quantum Circuit Assemblies within Cooling Apparatus

Figure 16A:
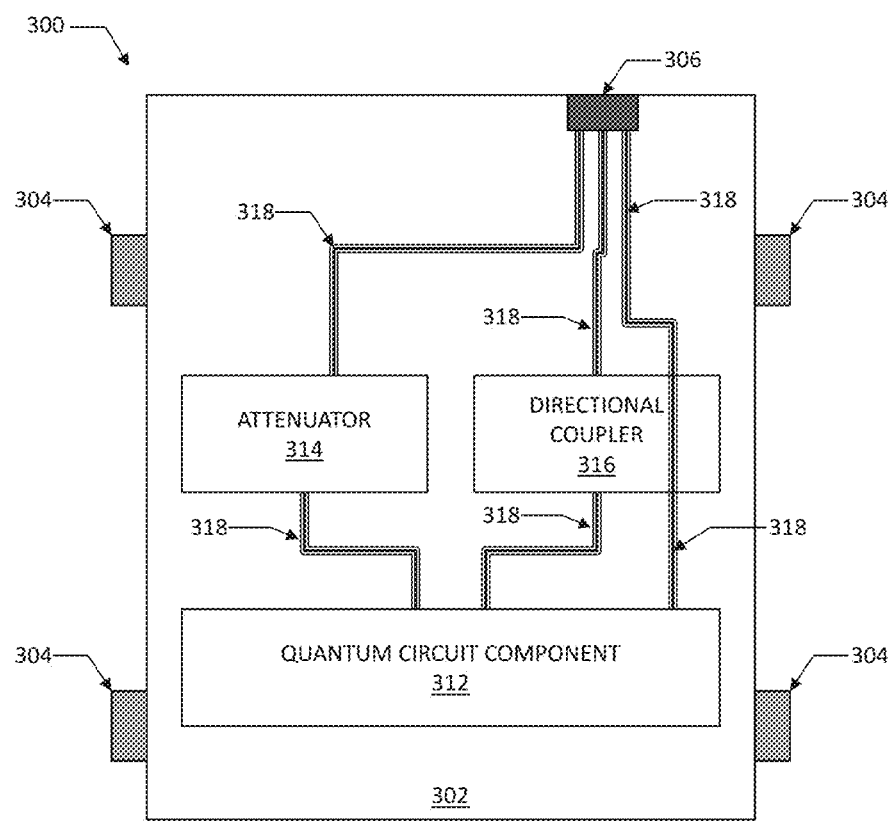
FIGS. 16A-16C provide schematic illustrations of an integrated quantum circuit assembly for a cooling apparatus, according to various embodiments of the present disclosure.
Figure 16B:
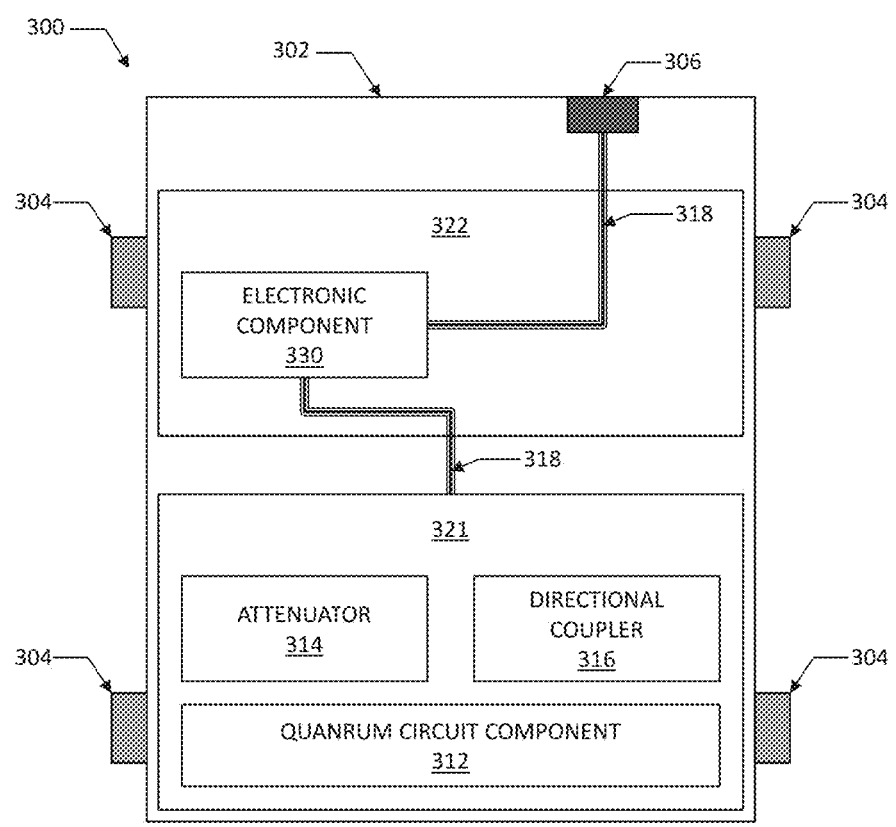
Figure 16C:
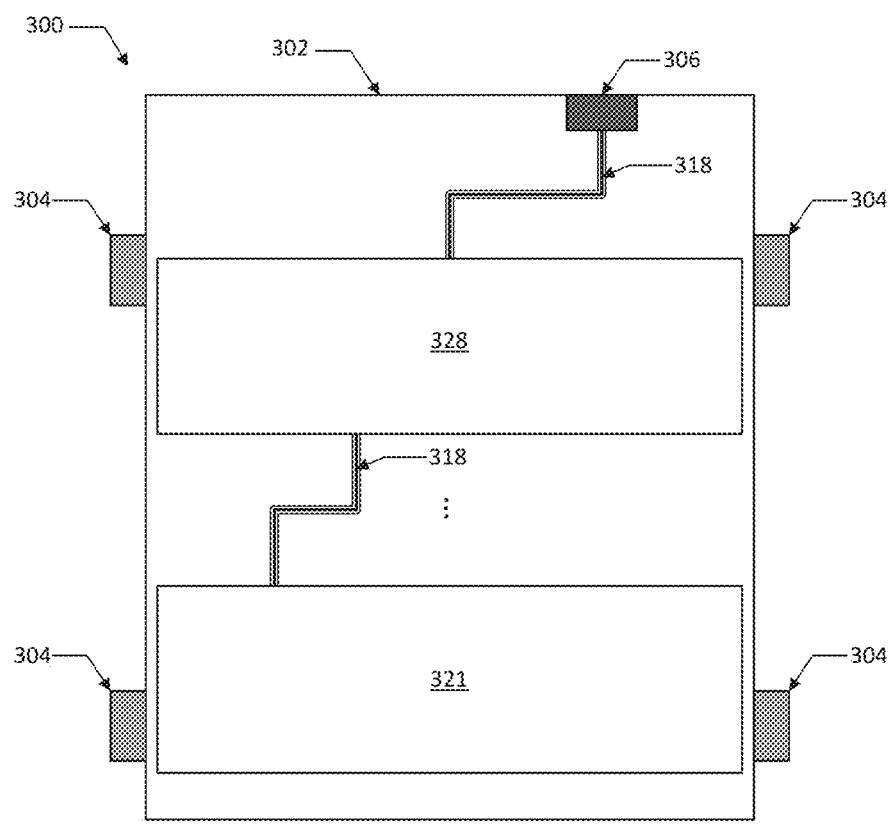

FIGS. 16A-16C provide schematic illustrations of an integrated quantum circuit assembly 300 for a cooling apparatus, according to various embodiments of the present disclosure.

FIG. 16A illustrates that, in some embodiments, the integrated quantum circuit assembly 300 may include a package 302, mechanical attachment means 304 for securing the package 302 within a cryogenic chamber of a cooling apparatus (e.g., within a cryogenic refrigeration system such as a dilution refrigerator), and electrical coupling means 306 for electrically coupling various components within the package 302 to electronic components outside of the package 302 (e.g., to the cooling apparatus or to components external to the cooling apparatus). The package 302 may include a plurality of components that are integral (i.e., included as a part of a whole, rather than supplied separately) to the package 302. As shown in FIG. 16A, the plurality of components of the package 302 may include, at least, a quantum circuit component 312, an attenuator 314, and a directional coupler 316. FIG. 16A further illustrates a plurality of interconnects 318 between various components of the integrated quantum circuit assembly 300. In some embodiments, at least some of the plurality of interconnects 318 may also be integral to the package 302.

The quantum circuit component 312 may include a die with any combination of one or more qubit devices, e.g. any one or more of the quantum dot qubits or superconducting qubits as described above. In general, the term "die" refers to a small block of semiconductor material/substrate on which a particular functional circuit is fabricated. On the other hand, an IC chip, also referred to as simply a chip or a microchip, sometimes refers to a semiconductor wafer on which thousands or millions of such devices or dies are fabricated. However, other times, an IC chip refers to a portion of a semiconductor wafer (e.g. after the wafer has been diced) containing one or more dies, or the terms "chip" and "die" are used interchangeably. The quantum circuit component 312 may be any component that includes one or more, typically a plurality, of qubits which may be used to perform quantum processing operations. For example, the quantum circuit component 312 may include one or more quantum dot devices 100 or one or more devices 200 or 211 implementing superconducting qubits. However, in general, the quantum circuit component 312 may include any type of qubits, all of which are within the scope of the present disclosure. In some embodiments, the quantum circuit component 312 may be included in the integrated quantum circuit assembly 300 as a part of a quantum processing device, e.g., a part of a quantum processing device 2026 described with reference to FIG. 21. In other words, in some embodiments, the quantum circuit component 312 included in the integrated quantum circuit assembly 300 may be a quantum processing device that may include one or more further components besides qubit devices, e.g., any one or more of the components of the quantum processing device 2026 described with reference to FIG. 21.

The attenuator 314 may be an electronic component configured to reduce incident power without significantly distorting the input waveform. Although only a single attenuator 314 is shown in FIG. 16A, a plurality of such attenuators may be included in the quantum circuit assembly 300. For example, when the one or more qubits devices of the quantum circuit component 312 are superconducting qubits, there would be a plurality of signal paths coupling the superconducting qubits to electronics which are external to the cooling apparatus (such electronics referred to herein as "external electronics") in which the quantum circuit assembly 300 may be operating. For example, one signal path may support provision of a current from the external electronics to at least one flux bias line of at least one superconducting qubit of the quantum circuit component 312, while another signal path may support provision of a current from the external electronics to at least one microwave drive line of at least one superconducting qubit of the quantum circuit component 312. In various embodiments, each signal path may include one or more interconnects similar to the interconnects 318. In various embodiments, at least some, or all, of each of such plurality of interconnects may include an attenuator such as the attenuator 314 in its path. Furthermore, in some embodiments, the quantum circuit assembly 300 may include a plurality of chambers, e.g., to be aligned with and/or kept at different temperature stages of a cooling apparatus (as will be described in greater detail with reference to FIGS. 17 and 18). In such embodiments, each of the chambers may include one or more attenuator such as the attenuator 314. In some such embodiments, if a given interconnect 318 traverses a plurality of chambers (or, rather, if a given signal being communicated between the quantum circuit component 312 and external electronics is to traverse a plurality of chambers over one or more interconnects 318), then it may traverse a plurality of attenuators 314—with at least one attenuator 314 included in one or more chambers.

The directional coupler 316 may be an electronic component configured to split power, e.g., substantially equally, between a plurality (e.g., two) ports. In some embodiments, the directional coupler 316 may include a multi-port circuit where one port is isolated from the input port. In some embodiments, the directional coupler 316 may include two transmission lines which are closely coupled to one another through energy exchange. In some embodiments, the directional coupler 316 may include one input port, one transmission (e.g., an output) port, and a both a couple and isolated port. For example, when the one or more qubits devices of the quantum circuit component 312 are superconducting qubits, the directional coupler 316 may be configured to add a signal that is output from a low-pass filter (LPF) to a signal provided from the quantum circuit component 312 (e.g., a signal output from an isolator configured to reduce or eliminate signal reflections back to the quantum circuit component 312), and output a resulting signal that is then provided to a quantum limited amplifier (QLA). In various embodiments, one or more of the LPF, the QLA, and the isolator may also be included within and be integral to the package 302 (although these further components are not shown in FIG. 16A). Although only a single directional coupler 316 is shown in FIG. 16A, a plurality of such directional couplers may be included in the quantum circuit assembly 300.

Although not specifically shown in FIG. 16A, in various embodiments, the package 302 may include additional components that may be integral to the package 302. Some of them, such as the LPF, the QLA, and the isolator, have been mentioned above. Other such components may include a DC block, a bias-T, a low-noise amplifier (LNA), a high-electron-mobility transistor (HEMT) amplifier, and an eccosorb filter. In general, an LPF is an electronic component configured to attenuate or block, in an incident signal, frequency components having frequency higher than a certain threshold frequency. In general, a QLA is an amplifier that may be used in quantum mechanical electronics for high gain with quantum-limited noise. One example of a QLA is a Josephson parametric amplifier (JPA), which, in some embodiments, may be characterized by relatively high gain, low noise, but limited bandwidth. Another example of a QLA is a traveling wave parametric amplifiers (TWPA), which, in some embodiments, may be characterized by relatively high gain, low noise, and high bandwidth. In some implementations, a JPA may be more suitable for single frequency applications, while a TWPA may be used in large bandwidth applications such as multiplexed readout, where each qubit readout frequency may be required to be different. In general, an isolator may be a two-port device configured to isolate the input port from the output port and will transmit signal in only one direction. An isolator may be used to limit reflections from the output port side reaching the input port side. Typical applications in the package 302 would be to include one or more isolators in the amplification chain, where isolators are used with amplifiers and placed after the quantum circuit component 312 to prevent unwanted signals reaching the quantum circuit component 312. In general, a DC block may be a specially designed capacitor, configured to attenuate or block DC signals without distorting and/or interfering with passed, higher-frequency, signals. In general, a bias-T is a T-component with three ports. One port may be the output, while the other two ports may serve as the DC and RF input ports, respectively. The output port of the bias-T component may represent the combined DC and RF signals, thus enabling a DC bias offset to any incoming RF signals. In general, an LNA may be an amplifier configured to amplify signals, e.g., low-power signals, while maintaining the incoming signal to noise ratio (SNR). In some embodiments, the response of an LNA included in the package 302 may be linear within its designed bandwidth. In general, a HEMT amplifier may be an amplifier configured to operate at relatively high frequencies and low temperatures while preserving a large gain and ultra-low noise figure. In some embodiments, a HEMT amplifier may be used at as low of temperature as 1 Kelvin, proving indispensable low-noise amplification in readout circuits for quantum computing. In general, an eccosorb filter may be a filter configured to attenuate electromagnetic interference by converting radio frequency energy to heat. In some embodiments, an eccosorb filter included in the quantum circuit assembly 300 may use a special eccosorb-based material (e.g., in epoxy form) within a metal housing for filtering infrared light from the quantum circuit component 312. Incoming infrared light can produce quasiparticles, which act as dissipative metallic conductors. Quasiparticles have the principle effect of decreasing coherence within the quantum circuit component 312 (i.e., reducing qubit coherence times). In some embodiments, an eccosorb filter may be a two-port device with relatively low attenuation and reflections within the bandwidth of application. In some embodiments, attenuation may be controlled by adjusting the length of the eccosorb device, hence adjusting the amount of eccosorb material interacting with the incoming signal. When the plurality of components integral to the package 302 include an eccosorb filter, e.g., in combination with an LPF, the LPF and the eccosorb filter may be configured to filter and attenuate electromagnetic interference by converting radio frequency energy to heat.

In some embodiments, the package 302 may be a hermetically sealed package. In some embodiments, the package 302 may be substantially under vacuum, e.g., the pressure within the package may be less than about $1 \times 10^{-3}$ bar, including all values and ranges therein, e.g., less than about $1 \times 10^{-4}$ bar, or less than about $1 \times 10^{-5}$ bar.

Turning to the mechanical attachment means 304, FIG. 16A only provides a schematic illustration of the mechanical attachment means 304. In various embodiments, any other number of the mechanical attachment means 304, placed at locations around the package that are different from what is shown in FIG. 16A, may be used. In general, the mechanical attachment means 304 may include any suitable structures/devices for securing the package 302 within a cryogenic chamber of a cooling apparatus, such as quick disconnects, lag bolts, twist-lock mechanisms, bayonet fasteners, threaded inserts, magnetic interfaces, self-centering attachment mechanisms with detents (all together sometimes colloquially referred to as "quick plate attachment points"). Quick disconnects may include clamping mechanisms that induce clamping pressure on hermetic seals to create seal after physical mounting. Clamping pressure may also be applied on temperature stages for conductive heat transfer. Lag bolts may be arranged such they extend along the length of the insert and have threads on either the interior or exterior of the assembly. The bolts may be tightened, applying pressure on seals and temperature stages. Twist-lock mechanisms work by inserting the apparatus, then twisting, which will interface with seals and temperature stages to apply pressure and lock into place. Bayonet fasteners may work in a similar fashion, where pins follow an incline and/or cam profile, to apply pressure on seals and temperature stages, prior to locking into position. Threaded inserts may operate by having the entire assembly rotate into the cooling apparatus, until sufficient clamping force is applied. Then the inserted assembly is locked into place. Magnetic interfaces may operate with strong permanent magnets, which may hold the temperature stages and sealing surfaces together. After pumping down, the added pressure will ensure good thermal contact. Self-centering mechanisms and assemblies may be applied in combination with any fastening technique described above, and may allow for the assembly to easily guide into final resting position. In some embodiments, the mechanical attachment means 304 may be configured to work together (e.g., fit) with corresponding mechanical attachment means of a cooling apparatus. In some embodiments, the mechanical attachment means 304 may be such that they can work together with different types of cooling apparatus. In some embodiments, the mechanical attachment means 304 may be integral to the package 302 (i.e., the package 302 and the attachment means 304 are configured to be inserted into the cooling apparatus and taken out of the cooling apparatus as a single unit, as a whole).

The form factor of the quantum circuit assembly 300 may be such that is may be suitable for placing into and taking out of a cooling apparatus, or, in some implementations, multiple cooling apparatus of different types. For example, in various embodiments, the quantum circuit assembly 300 may have a form factor suitable for placing the quantum circuit assembly 300 in a line-of-sight (LOS) port and/or a side loader port of a cooling apparatus. For example, in some embodiments, the quantum circuit assembly 300 may be a standard assembly that bolts into typical LOS ports or side loader ports of a cooling apparatus with quick plate attachment points. Such an assembly may help develop systems for rapidly bringing up quantum computers, enable sharing of quantum hardware between various institutions, and develop into a standard product.

Turning now to the electrical coupling means 306, FIG. 16A only provides a schematic illustration of the electrical coupling means 306. In various embodiments, any other number of the electrical coupling means 306, placed at locations around the package that are different from what is shown in FIG. 16A, may be used. In particular, while FIG. 16A illustrates that each of the quantum circuit component 312, the attenuator 314, and the directional coupler 316 may be electrically coupled to the electrical coupling means 306 using interconnects 318, in other embodiments, any of these and further components of the package 302 may be coupled to the electrical coupling means 306 not directly but via other components within the package 302. In addition, in various embodiments of the quantum circuit assembly 300, different components of the package 302 may be coupled to different instances of the electrical coupling means 306. In general, the electrical coupling means 306 may include any suitable structures/devices for enabling electrical connectivity of various components integral to the package 302 to other electronic components within a cooling apparatus and/or to external electronics outside of the cooling apparatus. In some embodiments, the electrical coupling means 306 may be configured to work together (e.g., fit) with corresponding electrical coupling means of a cooling apparatus. For example, for RF connectors there may be subminiature push-on (SMP), SMP micro (SMPM) SMP submicro (SMPSM), grouped RF connectors, and other means of establishing a spring contact, non-spring contact, and/or opposing gender type contact such as pin and jack. In another example, for optical (light) transmission, fiber optic lines and bundles could be connected via optical couplers and/or free space light transmission with various combinations of lens assemblies. For DC lines, D-type connectors, spring connectors, non-spring point connectors, and other variations including but not limited to pin and socket, opposing gender connectors, may be used. In some embodiments, the electrical coupling means 306 may be such that they can work together with different types of cooling apparatus. In some embodiments, the electrical coupling means 306 may be integral to the package 302 (i.e., the package 302 and the electrical coupling means 306 are configured to be inserted into the cooling apparatus and taken out of the cooling apparatus as a single unit, as a whole).

In some embodiments, the electrical coupling means 306 may include at least one connector for coupling at least one qubit device of the quantum circuit component 312 to an electronic component that, during operation of the quantum circuit assembly 300 placed inside of a cooling apparatus, may be outside of the cooling apparatus or at least outside of the quantum circuit assembly 300 (referred to in the following as an "external electronic component"). In some embodiments, such a connector may be integral to the package 302. Some example signals that may be supported by such a connector, or, in general, by the electrical coupling means 306 of the quantum circuit assembly 300, will now be described.

In some embodiments, the electrical coupling means 306 (e.g., a connector) may be configured to support provision of a DC signal from an external electronic component to at least one qubit device of the quantum circuit component 312.

In some embodiments, the quantum circuit component 312 may include at least one quantum dot qubit device (e.g., any of the quantum dot qubit devices described above). In some further embodiments, where at least one quantum dot qubit device includes at least one plunger gate, the electrical coupling means 306 (e.g., a connector) may be configured to support provision, e.g., from an external electronic component, of at least one plunger voltage to be applied to the at least one plunger gate to control formation of one or more quantum dots in the at least one qubit device. In some further embodiments, where at least one quantum dot qubit device includes two or more plunger gates and a barrier gate, the electrical coupling means 306 (e.g., a connector) may be configured to support provision, e.g., from an external electronic component, of at least one barrier voltage to be applied to the barrier gate to control a potential barrier between two adjacent plunger gates of the two or more plunger gates. In some further embodiments, where at least one quantum dot qubit device includes at least one plunger gate, at least one barrier gate, and at least one accumulation gate, the electrical coupling means 306 (e.g., a connector) may be configured to support provision, e.g., from an external electronic component, of at least one barrier voltage to be applied to the at least one barrier gate to control a potential barrier between the at least one plunger gate and an adjacent one of the at least one accumulation gate. In some further embodiments, where at least one quantum dot qubit device includes at least one accumulation gate, the electrical coupling means 306 (e.g., a connector) may be configured to support provision, e.g., from an external electronic component, of at least one accumulation voltage to be applied to the at least one accumulation gate to control a number of charge carriers in an area between an area where one or more quantum dots are to be formed and a charge carrier reservoir. The quantum circuit assembly 300 may include any combination of these examples of the electrical coupling means 306.

In some embodiments, the quantum circuit component 312 may include at least one superconducting qubit device (e.g., any of the superconducting qubits described above). In some further embodiments, at least one superconducting qubit device may include at least one flux bias line, and the electrical coupling means 306 (e.g., a connector) may be configured to support provision of a current, e.g., from an external electronic component, to the at least one flux bias line. In some further embodiments, at least one superconducting qubit device may include at least one microwave drive line, and the electrical coupling means 306 (e.g., a connector) may be configured to support provision of a current, e.g., from an external electronic component, to the at least one microwave drive line. In some embodiments where the quantum circuit component 312 includes at least one superconducting qubit device, the package 302 may further include a magnetic shield that is integral to the package 302, and at least some of the components of the package 302 may be at least partially, or fully, enclosed or shielded by such a magnetic shield. For example, in some embodiments, the quantum circuit component 312 may be at least partially, or fully, enclosed or shielded by such a magnetic shield. In another example, a band-pass filter (e.g., an LPF described above) and/or a filter configured to attenuate electromagnetic interference by converting radio frequency energy to heat (e.g., an eccosorb filter described above) may be at least partially, or fully, enclosed or shielded by such a magnetic shield. In some embodiments, the eccosorb filter may be coupled to the quantum circuit component 312 and the LPF may be coupled to the eccosorb filter. In some such embodiments, the attenuator 314 may be coupled to the quantum circuit component 312 by being coupled to the eccosorb filter. In other such embodiments, the attenuator 314 may be coupled to the quantum circuit component 312 by being coupled to the LPF.

One example use-case scenario for the quantum circuit assembly 300 may be that one or more of amplification, attenuation, high density cabling, and support struts are included in the quantum circuit assembly 300 up to the desired temperature stage of a cooling apparatus. One or more pre-attached quantum processors, e.g., in the form of one or more quantum circuit components 312, may be packaged and shielded at the mixing chamber (or any other cold stage of a cooling apparatus) as it will be part of the integrated assembly. Users may receive a hermetically sealed pre-attached quantum processor with hardware assembly with installation instructions for interfacing to their cooling apparatus for the desired input/output (I/O) configuration. In some embodiments, the package 302 of the quantum circuit assembly 300 may further include temperature sensors and/or other integrated sensors and associated electronics. In some embodiments, each stage of the quantum circuit assembly 300 may be modular allowing for rapid exchange of broken components and/or for upgrading existing assemblies.

FIGS. 16B and 16C provide schematic illustration of other embodiments of the quantum circuit assembly 300 described above. In FIGS. 16B and 16C, reference numerals which are the same as those used in FIG. 16A are intended to illustrate the same or analogous elements as those described with reference to FIG. 16A, so that, in the interests of brevity, their descriptions are not repeated for FIGS. 16B and 16C and instead only differences between these figures are described. FIG. 16B illustrates that, in some embodiments, the package 302 may include two chambers, shown as a chamber 321 and a chamber 322. In some embodiments, the quantum circuit component 312, the attenuator 314, and the directional coupler 316 may be included in the first chamber 321, while the second chamber 322 may include one or more other electronic components 330. Examples of such electronic components 330 include further attenuators 314, directional couplers 316, LNAs, LPFs, or any other electronic components that were described above as examples of what could be included in the package 302. FIG. 16C illustrates that, in general, the package 302 may include any number N of chambers, where N is an integer equal to or greater than 1, shown in FIG. 16C as a first chamber 321 and an Nth chamber 328. Any of the chambers may include any of the electronic components as described herein, as well as corresponding interconnects 318. Various chambers may be electrically coupled to one another. For example, electronic components of one of the N chambers may be electrically coupled to electronic components of one or more of the other chambers and/or to the electrical coupling means 306, either directly or indirectly. In some embodiments, at least some of the different chambers of the package 302 may be configured to be at different temperature stages of a cooling apparatus. In other words, at least some of the different chambers of the package 302 may be kept at different temperatures, or temperature ranges, during operation of the quantum circuit component 312 when the package 302 is secured within a cooling apparatus.

While FIGS. 16A-16C illustrate various embodiments of the integrated quantum circuit assembly 300 where the quantum circuit component 312 is included, in other embodiments, the same descriptions and drawings may be used to describe a housing for the quantum circuit component 312. In other words, without the quantum circuit component 312 placed therein, the integrated quantum circuit assembly 300 may be seen as a housing in which the quantum circuit component 312 is to be included. Such a housing may advantageously include other electronic components such as the attenuator 314 and the directional coupler 316, and further include at least some of the interconnects 318 therebetween. In this manner, the quantum circuit component 312 may be easily included, or taken out from, such a housing/assembly.

Figure 17:
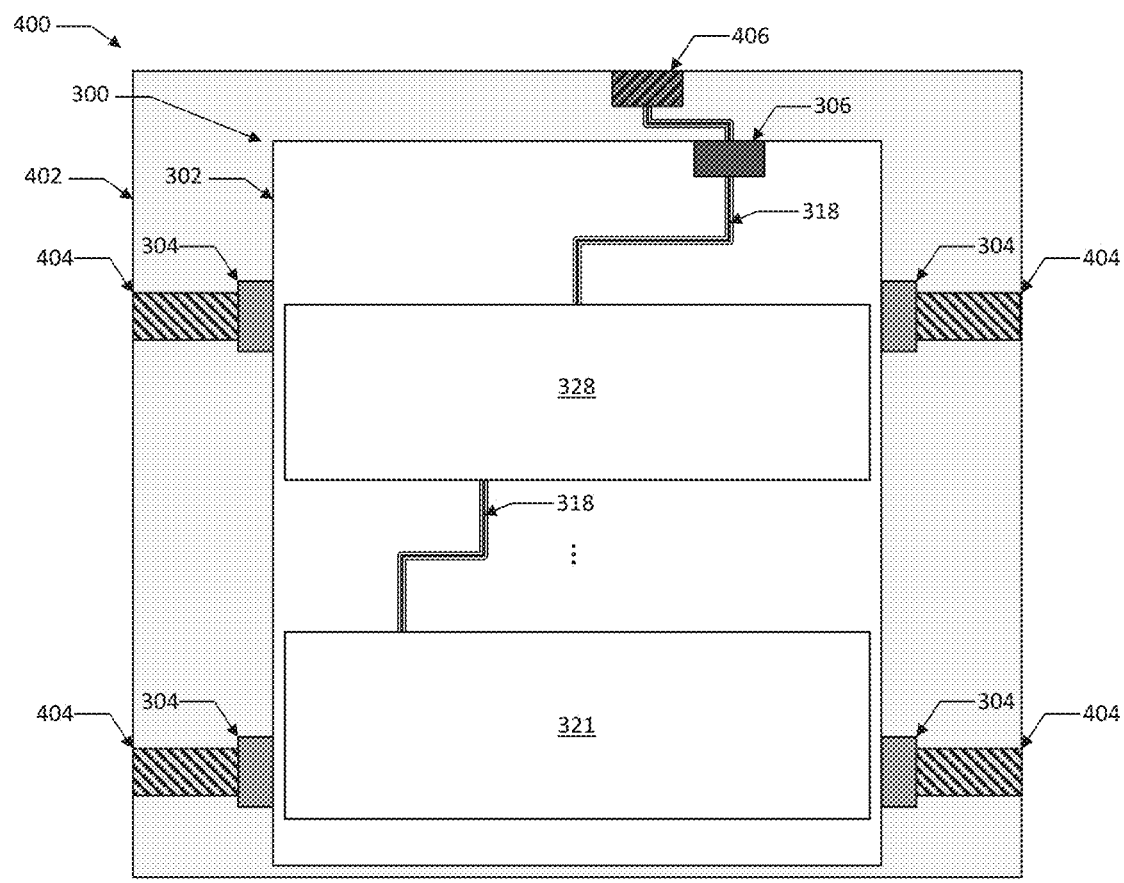
FIG. 17 provides a schematic illustration of an integrated quantum circuit assembly included within a cooling apparatus, according to some embodiments of the present disclosure.

FIG. 17 provides a schematic illustration of the integrated quantum circuit assembly 300 included within a cooling apparatus 400, according to some embodiments of the present disclosure. In FIG. 17, reference numerals which are the same as those used in FIGS. 16A-16C are intended to illustrate the same or analogous elements as those described with reference to FIGS. 16A-16C, so that, in the interests of brevity, their descriptions are not repeated for FIG. 17 and instead only differences between these figures are described.

The cooling apparatus 400 may be, e.g., a dilution refrigerator, a helium-3 refrigerator, or a liquid helium refrigerator. The cooling apparatus 400 may be configured to maintain the quantum circuit component 312 of the integrated quantum circuit assembly 300 at a predetermined low temperature during operation to avoid qubit decoherence and to reduce the effects of scattering in the quantum circuit component 312. This predetermined low temperature may vary depending on the setting; in some embodiments, the temperature may be 5 degrees Kelvin or less. The cooling apparatus 400 may be a cooling apparatus 2024 described with reference to FIG. 21.

As shown in FIG. 17, in some embodiments, the cooling apparatus 400 may include a cooling chamber 402 which may include one or more cooling stages (e.g., one or more areas configured to be kept at different low temperatures during operation of the quantum circuit component 312). The mechanical attachment means 304 of the quantum circuit assembly 300 may be configured to secure the package 302 within the chamber 402 of the cooling apparatus 400. To that end, the cooling apparatus 400 may have corresponding mechanical attachment means 404, configured to cooperate with the mechanical attachment means 304 of the quantum circuit assembly 300 to ensure proper attachment. Similarly, the cooling apparatus 400 may have corresponding electrical coupling means 406, configured to cooperate with the electrical coupling means 306 of the quantum circuit assembly 300 to ensure proper electrical coupling and exchange of signals as described herein.

Figure 18:
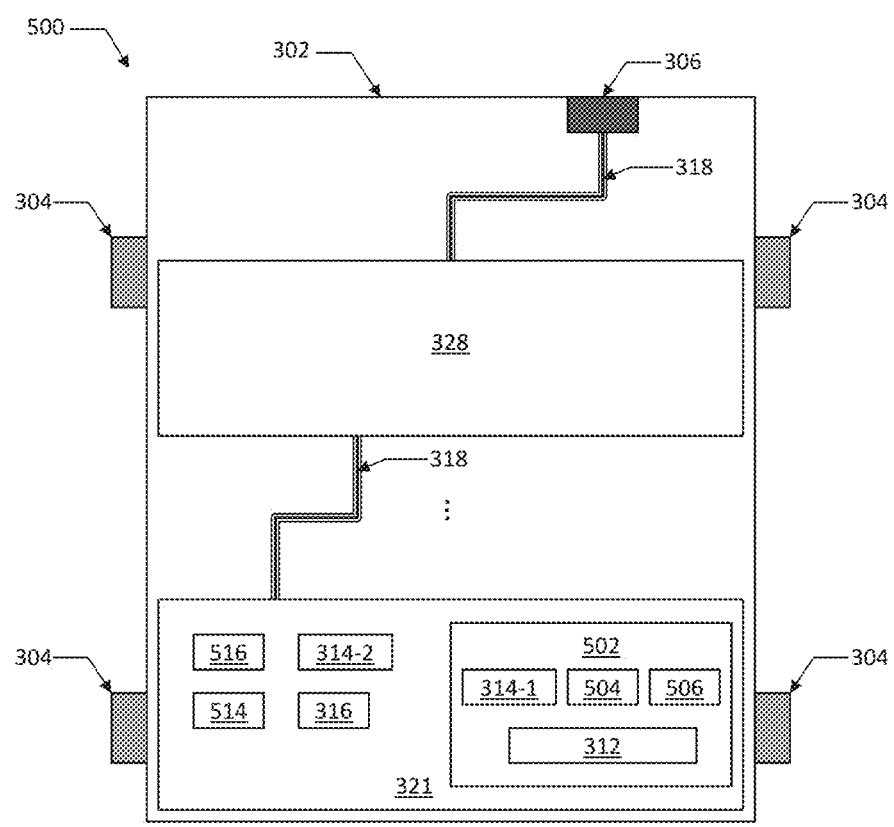
FIG. 18 provides a schematic illustration of an integrated quantum circuit assembly implementing superconducting qubits, according to some embodiments of the present disclosure.

FIG. 18 provides a schematic illustration of an integrated quantum circuit assembly 500 implementing superconducting qubits, according to some embodiments of the present disclosure. In FIG. 18, reference numerals which are the same as those used in FIGS. 16A-16C are intended to illustrate the same or analogous elements as those described with reference to FIGS. 16A-16C, so that, in the interests of brevity, their descriptions are not repeated for FIG. 18 and instead only differences between these figures are described.

The quantum circuit assembly 500 may be seen as an example of the quantum circuit assembly 500 where the qubits of the quantum circuit component 312 are superconducting qubits. In such an example, the first chamber 321 may include a plurality of components which are at least partially enclosed by a magnetic shield 502. Such components may include the quantum circuit component 312, a first attenuator 314-1 (which may be one instance of the attenuator 314, described above), a band-pass filter 504, and a filter 506 (e.g., an eccosorb filter) configured to attenuate electromagnetic interference by converting radio frequency energy to heat. In some embodiments, the filter 506 may be coupled to the quantum circuit component 312. In some embodiments, the band-pass filter 504 may be coupled to the filter 506. In some embodiments, the first attenuator 314-1 may be coupled to the quantum circuit component 312 directly. In other embodiments, the first attenuator 314-1 may be coupled to the quantum circuit component 312 by being coupled to the band-pass filter 504 and the band-pass filter 504 being coupled to the quantum circuit component 312, e.g., via the filter 506.

As further shown in FIG. 18, in some embodiments, some other electronic components of the first chamber 321 may not be enclosed by the magnetic shield 502. Such components may include the directional coupler 316, a second attenuator 314-2 (which may be another instance of the attenuator 314, described above), a QLA 514, and an isolator 516. In some embodiments, the second attenuator 314-2 may be coupled to the quantum circuit component 312 by being coupled to the isolator 516, the isolator 516 being coupled to the QLA 514, the QLA 514 being coupled to the directional coupler 316, and the directional coupler 316 being coupled to the quantum circuit component 312, e.g., via another isolator 516.

FIG. 18 further illustrates that the package 302 may include a plurality of chambers, which chambers may be kept at different low temperatures. In some embodiments, the Nth chamber 328 shown in FIG. 18 may be a second chamber and it may include a logic component (not shown in FIG. 18) coupled to the quantum circuit component 312. In some embodiments, such a logic component may be configured to control operation of the quantum circuit assembly 500, e.g., to control communication of signals via the electrical coupling means 306, e.g., as described above.

Example Devices and Systems

Quantum circuit components that may be integrated within a package of an integrated quantum circuit assembly for inclusion within a cooling apparatus as described above may be implemented using any kind of qubit devices or included in any kind of quantum processing devices/structures. Some examples of such devices/structures are illustrated in FIGS. 19A-19B, 20, and 21.

Figures 19A, 19B:
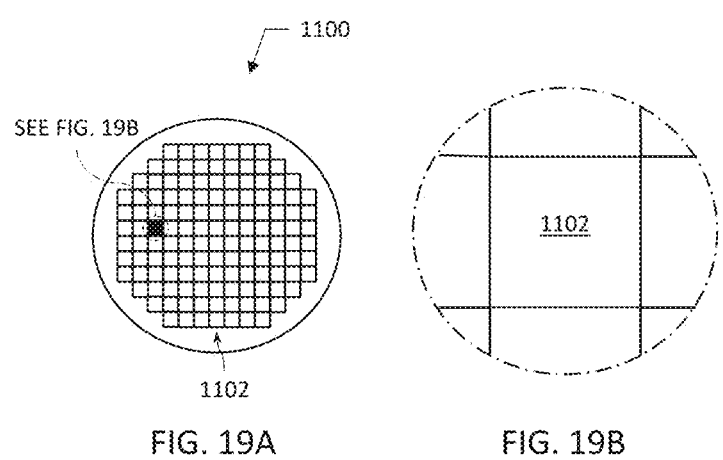
FIGS. 19A and 19B are top views of a wafer and dies that may include one or more of qubit devices disclosed herein.

FIGS. 19A-19B are top views of a wafer 1100 and dies 1102 that may be formed from the wafer 1100, according to some embodiments of the present disclosure. The dies 1102 may include any of the qubit devices disclosed herein, e.g. the qubit devices described with reference to FIGS. 1-15, any further embodiments of such qubit devices as described herein, or any combinations of such qubit devices. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component, e.g., the quantum circuit component 312 as described herein. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 21) or other logic that is configured to store information in the memory devices or execute instructions stored in the memory array.

Figure 20:
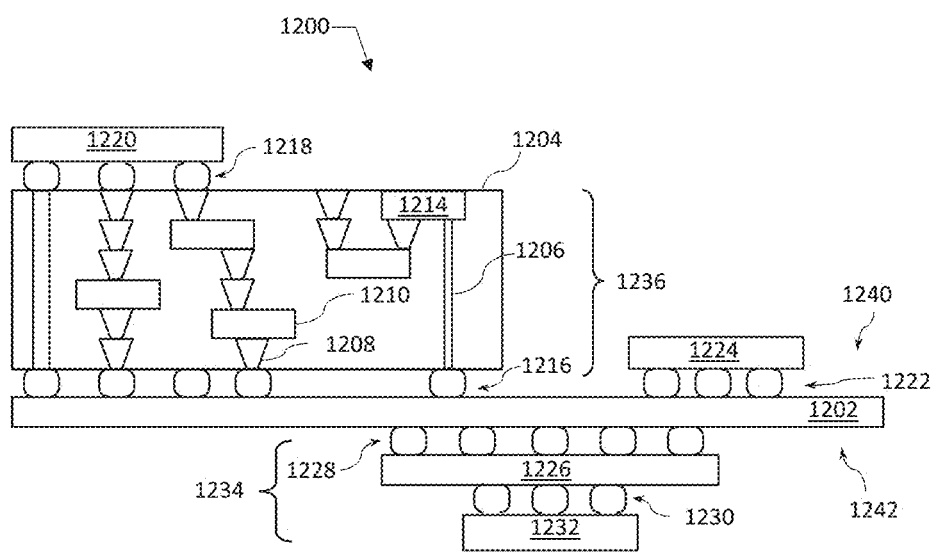
FIG. 20 is a cross-sectional side view of a device assembly that may include one or more of qubit devices disclosed herein.

FIG. 20 is a cross-sectional side view of a device assembly 1200 that may be included in any of the embodiments of the quantum circuit components disclosed herein. For example, in various embodiments, the device assembly 1200 may be included in, or may include, the quantum circuit component 312. In general, the device assembly 1200 may be integrated within a package of an integrated quantum circuit assembly for inclusion within a cooling apparatus, e.g., within the package 302, as described herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 20 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 20), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 20, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g. a package including any of the qubit devices disclosed herein, e.g. the qubit devices described with reference to FIGS. 1-15, any further embodiments of such qubit devices as described herein, or any combinations of such qubit devices; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 20, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including any qubit devices disclosed herein, e.g. the qubit devices described with reference to FIGS. 1-15, any further embodiments of such qubit devices as described herein, or any combinations of such qubit devices; or may be a conventional IC package, for example. In some embodiments, the package 1224 may take the form of any of the embodiments of the quantum circuit component 312 to be integrated within a package of an integrated quantum circuit assembly for inclusion within a cooling apparatus as described herein.

The device assembly 1200 illustrated in FIG. 20 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

Figure 21:
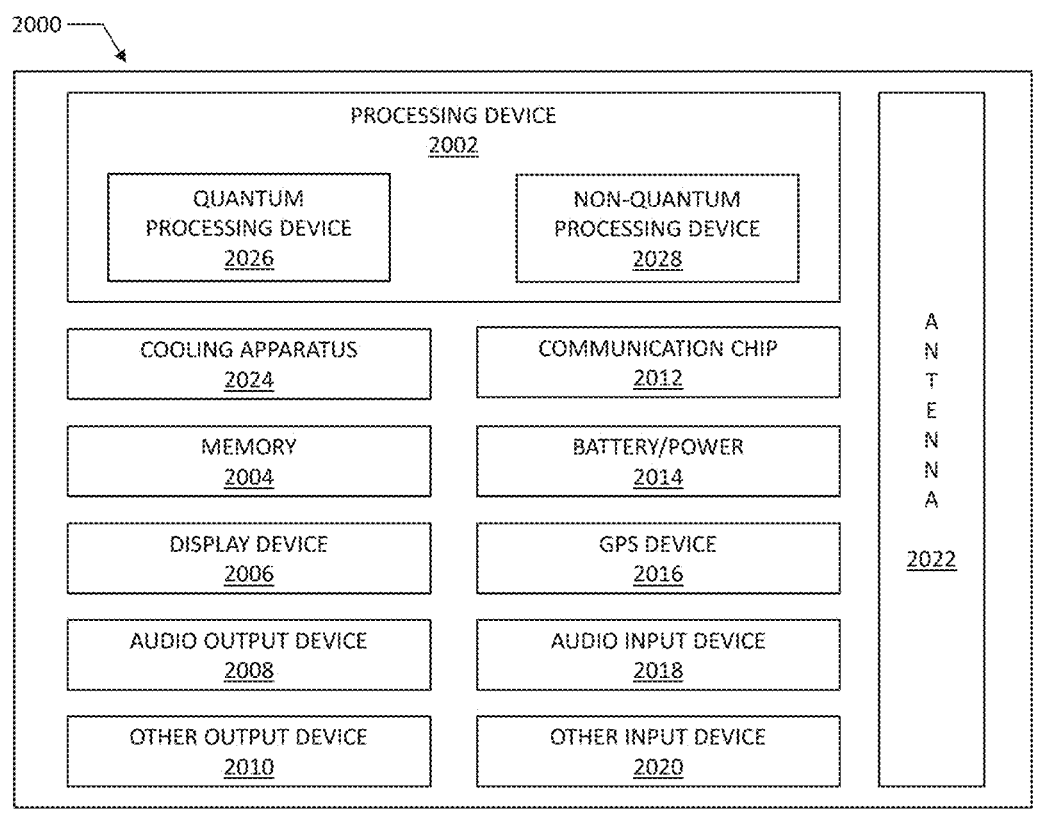
FIG. 21 is a block diagram of an example quantum computing device that may include one or more of qubit devices disclosed herein, in accordance with various embodiments.

FIG. 21 is a block diagram of an example quantum computing device 2000 that may include any of the qubit devices disclosed herein, e.g. the qubit devices described with reference to FIGS. 1-15, any further embodiments of such qubit devices as described herein, or any combinations of such qubit devices. A number of components are illustrated in FIG. 21 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 21, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030, and may instead operate at room temperature. In some embodiments, the cooling apparatus 2024 may be the cooling apparatus 400 in which an integrated quantum circuit assembly, e.g., with the package 302, as described herein, may be included.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). In various embodiments, the quantum processing device 2026 may include, or be included in, any of the quantum circuit components disclosed herein, e.g. one or more of the quantum circuit components 312 with any of the qubit devices disclosed herein, e.g. the qubit devices described with reference to FIGS. 1-15, any further embodiments of such qubit devices as described herein, or any combinations of such qubit devices, and may perform data processing by performing operations on the qubits that may be generated in the quantum circuit components 312, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide examples of various ones of the embodiments disclosed herein.

Example 1 provides a quantum circuit assembly that includes a package and mechanical attachment means for securing the package within a cryogenic chamber of a cooling apparatus (e.g., a cryogenic refrigeration system such as a dilution refrigerator). The package includes a plurality of components that are integral (i.e., included as a part of a whole, rather than supplied separately) to the package. The plurality of components include a quantum circuit component, the quantum circuit component having at least one qubit device, an attenuator, coupled to the quantum circuit component, and a directional coupler, also coupled to the quantum circuit component.

Example 2 provides the quantum circuit assembly according to example 1, where the package is a hermetically sealed package.

Example 3 provides the quantum circuit assembly according to examples 1 or 2, where a pressure within the package is less than about $1\times10^{-3}$ bar, including all values and ranges therein, e.g., less than about $1\times10^{-4}$ bar, or less than about $1\times10^{-5}$ bar.

Example 4 provides the quantum circuit assembly according to any one of the preceding examples, where the attenuator is a first attenuator, the quantum circuit component, the first attenuator, and the directional coupler are in a first chamber of the package, the package further includes a second chamber including a second attenuator, coupled to the first attenuator (thus, the second attenuator is coupled to the quantum circuit component, via the first attenuator), and, during operation of the quantum circuit component, the package is to be secured within the cooling apparatus so that the first chamber is kept at a first cryogenic temperature and the second chamber is kept at a second cryogenic temperature, where the second cryogenic temperature is higher than the first cryogenic temperature.

Example 5 provides the quantum circuit assembly according to example 4, where the second chamber further includes a logic component, coupled to the quantum circuit component.

Example 6 provides the quantum circuit assembly according to any one of the preceding examples, where the attachment means are integral to the package (i.e., the package and the attachment means are configured to be inserted into the cooling apparatus and taken out of the cooling apparatus as a single unit, as a whole).

Example 7 provides the quantum circuit assembly according to any one of the preceding examples, further including electrical coupling means including a connector for coupling the at least one qubit device to an electronic component that, during operation of the quantum circuit assembly, is outside of the cooling apparatus.

Example 8 provides the quantum circuit assembly according to example 7, where the connector is integral to the package (i.e., the package and the connector are configured to be inserted into the cooling apparatus and taken out of the cooling apparatus as a single unit, as a whole).

Example 9 provides the quantum circuit assembly according to examples 7 or 8, where the connector is configured to support provision of a direct current (DC) from the electronic component to the at least one qubit device.

Example 10 provides the quantum circuit assembly according to examples 7 or 8, where the at least one qubit device includes at least one quantum dot qubit device that includes at least one plunger gate, and the connector is configured to support provision, from the electronic component, of at least one plunger voltage to be applied to the at least one plunger gate to control formation of one or more quantum dots in the at least one qubit device.

Example 11 provides the quantum circuit assembly according to examples 7 or 8, where the at least one qubit device includes at least one quantum dot qubit device that includes two or more plunger gates and a barrier gate, and the connector is configured to support provision, from the electronic component, of at least one barrier voltage to be applied to the barrier gate to control a potential barrier between two adjacent plunger gates of the two or more plunger gates.

Example 12 provides the quantum circuit assembly according to examples 7 or 8, where the at least one qubit device includes at least one quantum dot qubit device that includes at least one plunger gate, at least one barrier gate, and at least one accumulation gate, and the connector is configured to support provision, from the electronic component, of at least one barrier voltage to be applied to the at least one barrier gate to control a potential barrier between the at least one plunger gate and an adjacent one of the at least one accumulation gate.

Example 13 provides the quantum circuit assembly according to examples 7 or 8, where the at least one qubit device includes at least one quantum dot qubit device that includes at least one accumulation gate, and the connector is configured to support provision, from the electronic component, of at least one accumulation voltage to be applied to the at least one accumulation gate to control a number of charge carriers in an area between an area where one or more quantum dots are to be formed and a charge carrier reservoir.

Example 14 provides the quantum circuit assembly according to examples 7 or 8, where the at least one qubit device includes at least one superconducting qubit device that includes at least one flux bias line, and the connector is configured to support provision of a current from the electronic component to the at least one flux bias line.

Example 15 provides the quantum circuit assembly according to examples 7 or 8, where the at least one qubit device includes at least one superconducting qubit device that includes at least one microwave drive line, and the connector is configured to support provision of a current from the electronic component to the at least one microwave drive line.

Example 16 provides the quantum circuit assembly according to any one of examples 1-9 and 14-15, where the at least one qubit device includes at least one superconducting qubit device, the plurality of components further includes a magnetic shield, and the quantum circuit component is at least partially enclosed by the magnetic shield.

Example 17 provides the quantum circuit assembly according to example 16, where the plurality of components further includes a band-pass filter (e.g., a low-pass filter) and a filter configured to attenuate electromagnetic interference by converting radio frequency energy to heat, and the band-pass filter and the filter configured to attenuate electromagnetic interference by converting radio frequency energy to heat are at least partially enclosed by the magnetic shield.

Example 18 provides the quantum circuit assembly according to example 17, where the filter configured to attenuate electromagnetic interference by converting radio frequency energy to heat is coupled to the quantum circuit component, and the band-pass filter is coupled to the filter configured to attenuate electromagnetic interference by converting radio frequency energy to heat.

Example 19 provides the quantum circuit assembly according to example 18, where the attenuator is coupled to the quantum circuit component by being coupled to the filter configured to attenuate electromagnetic interference by converting radio frequency energy to heat.

Example 20 provides the quantum circuit assembly according to example 18, where the attenuator is coupled to the quantum circuit component by being coupled to the band-pass filter.

Example 21 provides the quantum circuit assembly according to any one of examples 1-9 and 14-20, where the plurality of components further includes a quantum limited amplifier.

Example 22 provides the quantum circuit assembly according to any one of examples 1-9 and 14-21, where the plurality of components further includes an isolator.

Example 23 provides the quantum circuit assembly according to any one of the preceding examples, having a form factor for placing the quantum circuit assembly in a line-of-sight (LOS) port of the cooling apparatus.

Example 24 provides the quantum circuit assembly according to any one of the preceding examples, having a form factor for placing the quantum circuit assembly in a side loader port of the cooling apparatus.

Example 25 provides a housing for a quantum circuit component. The housing includes a chamber for receiving the quantum circuit component that includes at least one qubit device; one or more components included in the chamber, the one or more components including an attenuator, configured to be coupled to the quantum circuit component when the quantum circuit component is in the chamber; and mechanical attachment means for securing the chamber within a cryogenic chamber of a cooling apparatus (e.g., a cryogenic refrigeration system such as a dilution refrigerator).

Example 26 provides the housing according to example 25, where the one or more components further include a magnetic shield, the magnetic shield configured to encompass at least a portion of the quantum circuit component when the quantum circuit component is in the chamber.

Example 27 provides the housing according to examples 25 or 26, where the one or more components further include a directional coupler, the directional coupler configured to be coupled to the quantum circuit component when the quantum circuit component is in the chamber.

Example 28 provides the housing according to any one of examples 25-27, where the chamber, the one or more components, and the attachment means are integral to the housing (i.e., the chamber, the one or more components, and the attachment means are configured to be placed into the cooling apparatus and taken out of the cooling apparatus in a housing as a single unit).

Example 29 provides the housing according to any one of examples 25-28, further including electrical coupling means including a connector for coupling, when the quantum circuit component is in the chamber, the at least one qubit device to an electronic component that, during operation of the quantum circuit assembly, is outside of the cooling apparatus.

Example 30 provides the housing according to any one of examples 25-29, where the connector is integral to the housing (i.e., the chamber, the one or more components, the attachment means, and the connector are configured to be placed into the cooling apparatus and taken out of the cooling apparatus in a housing as a single unit).

Example 31 provides the housing according to any one of examples 25-30, where the housing is for being placed in a line-of-sight (LOS) port or a side loader port of the cooling apparatus.

Example 32 provides the housing according to any one of examples 25-31, where, when the quantum circuit component is in the chamber, the housing forms the quantum circuit assembly according to any one of the preceding examples, e.g., any one of examples 1-25.

Example 33 provides a cooling apparatus for receiving a quantum circuit assembly. The cooling apparatus includes a chamber for receiving a housing, where the housing includes a quantum circuit component, integral to the housing, the quantum circuit component having at least one qubit device, one or more electronic components, integral to the housing, the one or more electronic components coupled to at least one qubit device, and first attachment means for securing the housing within the chamber. The cooling apparatus further includes second attachment means for cooperating with the first attachment means to secure the housing within the chamber. The cooling apparatus also includes a connector for providing signals to and/or receiving signals from the quantum circuit component when the quantum circuit component is in the chamber, where the chamber is configured to maintain a temperature of the quantum circuit assembly below a threshold temperature (e.g. 5 degrees Kelvin) during operation of the quantum circuit component.

Example 34 provides the cooling apparatus according to example 33, where the connector is included at an input/output (I/O) port of the cooling apparatus, the I/O port configured for coupling, when the quantum circuit component is in the chamber, the quantum circuit component to external circuitry outside of the cooling apparatus. Example 35 provides the cooling apparatus according to examples 33 or 34, where the cooling apparatus is a dilution refrigerator, a cooling apparatus with pulse tubes, and/or a 1 Kelvin pot. Example 36 provides the cooling apparatus according to any one of examples 33-35, where the housing to be placed in the chamber of the cooling apparatus is the housing according to any one of the preceding examples, e.g., according to any one of examples 25-31. Example 37 provides the cooling apparatus according to any one of examples 33-36, where the housing to be placed in the chamber of the cooling apparatus is the quantum circuit assembly according to any one of the preceding examples, e.g., according to any one of examples 1-25.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum circuit assembly, comprising:
   a package that includes a plurality of components that are integral within the package and are hermetically sealed in the package with a pressure within the package being less than 1×10⁻³ bar, the plurality of components comprising:
  a quantum circuit component, the quantum circuit component having at least one qubit device,
  an attenuator, coupled to the quantum circuit component, and
  a directional coupler, coupled to the quantum circuit component; and
attachment means for securing the package within a cooling apparatus.

2. The quantum circuit assembly according to claim 1, wherein:
  the attenuator is a first attenuator,
  the quantum circuit component, the first attenuator, and the directional coupler are in a first chamber of the package,
  the package further includes a second chamber comprising a second attenuator, coupled to the first attenuator, and
  during operation of the quantum circuit component, the package is to be secured within the cooling apparatus so that the first chamber is kept at a first cryogenic temperature and the second chamber is kept at a second cryogenic temperature, where the second cryogenic temperature is higher than the first cryogenic temperature.

3. The quantum circuit assembly according to claim 2, wherein the second chamber further includes a logic component, coupled to the quantum circuit component.

4. The quantum circuit assembly according to claim 1, wherein the attachment means are integral to the package.

5. The quantum circuit assembly according to claim 1, further comprising a connector for coupling the at least one qubit device to an electronic component that, during operation of the quantum circuit assembly, is outside of the cooling apparatus.

6. The quantum circuit assembly according to claim 5, wherein the connector is integral to the package.

7. The quantum circuit assembly according to claim 5, wherein the connector is configured to support provision of a direct current (DC) from the electronic component to the at least one qubit device.

8. The quantum circuit assembly according to claim 5, wherein:
  the at least one qubit device includes at least one quantum dot qubit device that includes at least one plunger gate, and
  the connector is configured to support provision, from the electronic component, of at least one plunger voltage to be applied to the at least one plunger gate to control formation of one or more quantum dots in the at least one qubit device.

9. The quantum circuit assembly according to claim 5, wherein:
  the at least one qubit device includes at least one quantum dot qubit device that includes two or more plunger gates and a barrier gate, and
  the connector is configured to support provision, from the electronic component, of at least one barrier voltage to be applied to the barrier gate to control a potential barrier between two adjacent plunger gates of the two or more plunger gates.

10. The quantum circuit assembly according to claim 5, wherein:
  the at least one qubit device includes at least one superconducting qubit device that includes at least one flux bias line, and
  the connector is configured to support provision of a current from the electronic component to the at least one flux bias line.

11. The quantum circuit assembly according to claim 1, wherein:
  the at least one qubit device includes at least one superconducting qubit device,
  the plurality of components further includes a magnetic shield, and
  the quantum circuit component is at least partially enclosed by the magnetic shield.

12. The quantum circuit assembly according to claim 11, wherein:
  the plurality of components further includes a band-pass filter and a filter configured to attenuate electromagnetic interference by converting radio frequency energy to heat, and
  the band-pass filter and the filter configured to attenuate electromagnetic interference by converting radio frequency energy to heat are at least partially enclosed by the magnetic shield.

13. The quantum circuit assembly according to claim 1, wherein the plurality of components further includes a quantum limited amplifier.

14. The quantum circuit assembly according to claim 1, wherein the plurality of components further includes an isolator.

15. The quantum circuit assembly according to claim 1, having a form factor for placing the quantum circuit assembly in a line-of-sight port or in a side loader port of the cooling apparatus.

16. A housing for a quantum circuit component, the housing comprising:
  a chamber for receiving the quantum circuit component that includes at least one qubit device;
  one or more components included in the chamber, the one or more components including an attenuator, configured to be coupled to the quantum circuit component when the quantum circuit component is in the chamber; and
  attachment means for securing the chamber within a cooling apparatus,
  wherein the one or more components are integral in the chamber so that the housing with the one or more components is to be inserted in and taken out of the cooling apparatus as a whole.

17. The housing according to claim 16, wherein the one or more components further include a magnetic shield, the magnetic shield configured to encompass at least a portion of the quantum circuit component when the quantum circuit component is in the chamber.

18. A cooling apparatus for receiving a quantum circuit assembly, the cooling apparatus comprising:
  a chamber for receiving a housing, wherein the housing includes:
    a quantum circuit component that is integral in the housing, the quantum circuit component having at least one qubit device,
    one or more electronic components that are integral in the housing, the one or more electronic components coupled to at least one qubit device, and first attachment means for securing the housing within the chamber;

second attachment means for cooperating with the first attachment means to secure the housing within the chamber; and a connector for providing signals to and/or receiving signals from the quantum circuit component when the quantum circuit component is in the chamber, wherein the chamber is configured to maintain a temperature of the quantum circuit assembly below a threshold temperature during operation of the quantum circuit component, and wherein the quantum circuit component and the one or more electronic components are integral in the housing in that the housing, the quantum circuit component and the one or more electronic components are to be inserted in and taken out of the chamber of the cooling apparatus as a single unit.

19. The cooling apparatus according to claim 18, wherein the connector is included at an input/output (I/O) port of the cooling apparatus, the I/O port configured for coupling, when the quantum circuit component is in the chamber, the quantum circuit component to external circuitry outside of the cooling apparatus.

20. The quantum circuit assembly according to claim 1, wherein the plurality of components are integral within the package in that the plurality of components and the package are to be inserted in and taken out of the cooling apparatus as a single unit.

\* \* \* \* \*